(12) United States Patent
Matsui et al.

(10) Patent No.: US 8,278,804 B2
(45) Date of Patent: Oct. 2, 2012

(54) MULTICOLOR LIGHT-EMITTING ORGANIC EL DISPLAY DEVICE AND METHOD OF MANUFACTURING MULTICOLOR LIGHT-EMITTING ORGANIC EL DISPLAY DEVICE

(75) Inventors: Masafumi Matsui, Kyoto (JP); Kouhei Koresawa, Kyoto (JP); Takashi Ohta, Osaka (JP); Kenji Okumoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/331,279

(22) Filed: Dec. 20, 2011

(65) Prior Publication Data

US 2012/0086332 A1   Apr. 12, 2012

Related U.S. Application Data

(63) Continuation of application No. PCT/JP2010/004172, filed on Jun. 23, 2010.

(30) Foreign Application Priority Data

Jun. 25, 2009   (JP) .................................. 2009-151441

(51) Int. Cl.
   *H05B 33/10*   (2006.01)
   *H05B 33/12*   (2006.01)
   *H01L 51/50*   (2006.01)
   *H01L 27/32*   (2006.01)

(52) U.S. Cl. ......................... 313/112; 313/504; 313/506

(58) Field of Classification Search ........................ None
See application file for complete search history.

(56) References Cited

U.S. PATENT DOCUMENTS

2007/0194679 A1   8/2007   Jo et al.
2009/0212687 A1*  8/2009   Cok .............................. 313/504

FOREIGN PATENT DOCUMENTS

| JP | 2000-021570 | 1/2000 |
|----|-------------|--------|
| JP | 2000-106276 | 4/2000 |
| JP | 2003-173875 | 6/2003 |
| JP | 2003-178879 | 6/2003 |
| JP | 2006-310075 | 11/2006 |
| JP | 2007-226239 | 9/2007 |
| JP | 2007-280901 | 10/2007 |
| JP | 2009-032576 | 2/2009 |

OTHER PUBLICATIONS

International Search Report of PCT/JP2010/004172, dated Sep. 28, 2010.

* cited by examiner

*Primary Examiner* — Ashok Patel
(74) *Attorney, Agent, or Firm* — Greenblum & Bernstein, P.L.C.

(57) ABSTRACT

A multicolor light-emitting organic electroluminescent (EL) display device including a plurality of organic EL light-emitting regions including a red light-emitting layer, a green light-emitting layer, and a blue light-emitting layer on a main substrate includes: a magenta color filter, as a first light-adjusting layer, having predetermined transmission property for blue light and red light; and a second light-adjusting layer having predetermined absorption property for light with a wavelength intermediate between the red light and green light, wherein the magenta color filter is laid over the blue light-emitting layer, the red light-emitting layer, and a bank which is a non light-emitting region, and the second light-adjusting layer is laid over the blue light-emitting layer, the green light-emitting layer, the red light-emitting layer, and the bank which is the non light-emitting region.

20 Claims, 18 Drawing Sheets

MULTICOLOR LIGHT-EMITTING ORGANIC EL DISPLAY DEVICE AND METHOD OF MANUFACTURING MULTICOLOR LIGHT-EMITTING ORGANIC EL DISPLAY DEVICE

CROSS REFERENCE TO RELATED APPLICATIONS

This is a continuation application of PCT Patent Application No. PCT/JP2010/004172 filed on Jun. 23, 2010, designating the United States of America, which is based on and claims priority of Japanese Patent Application No. 2009-151441 filed on Jun. 25, 2009. The entire disclosures of the above-identified applications, including the specifications, drawings and claims are incorporated herein by reference in their entirety.

BACKGROUND OF THE INVENTION (1) Field of the Invention

The present invention relates to an organic electroluminescence (EL) display device capable of emitting light in multiple colors.

(2) Description of the Related Art

An organic EL display device is a light-emitting display device utilizing electroluminescence of organic compound, and has been in practical use as a small display device used for mobile phones, for example.

The organic EL display device includes organic EL elements arranged on a substrate, and each of the organic EL display elements of a pixel can be individually controlled for light emission. The organic EL display device capable of emitting light in multiple colors includes single-color light-emitting organic EL elements each emits light in different colors (different wavelengths) such as blue, green, or red arranged periodically.

Requirements for the display quality of color display devices including multicolor light-emitting organic EL display device is that chromatic purity of outgoing light is high and that images with high contrast can be displayed. Conventionally, various display devices have been developed to accommodate these needs.

Here, high chromatic purity indicates that, in a region in chromaticity coordinates surrounded by a trajectory of single-wavelength light in visible light range, a larger part of the region can be represented.

Contrast indicates a ratio of luminance at a non-light emitting region and a light-emitting region (luminance of light-emitting region divided by luminance of non-light emitting region). When the luminance of the non-light emitting region is high due to reflected external light, the contrast is inherently low, and the display device cannot display a sharp image. On the other hand, when the luminance of the non-light emitting region is low, the contrast is high, and deeper black can be displayed, allowing the display device to display a sharp image.

Patent Literature 1 (Japanese Unexamined Patent Application Publication No. 2003-173875) discloses a multicolor-light emitting organic EL display device with a wavelength selectivity that allows a portion of a wavelength selecting layer (color filter) corresponding to each organic EL element to selectively transmit light in blue, green, or red generated by the organic EL element.

A conventional configuration for providing visible light absorbing material on the non-light emitting region between adjacent organic EL elements (referred to as black matrix) may be combined with this configuration.

By using a combination of color filters and black matrix in the multicolor light-emitting organic EL display device, a color filter with a wavelength selecting property suitable for the color of outgoing light increases the chromatic purity of outgoing light from each organic EL element, and the visible-light absorbing material absorbing the external light allows a display of an image with high contrast.

Patent Literature 2 (Japanese Unexamined Patent Application Publication No. 2007-226239) discloses a display filter which absorbs light at a wavelength between the wavelengths of two outgoing light (for example, an intermediate wavelength between blue and green and an intermediate wavelength between green and red) at the entire surface and a plasma display panel using the display filter.

With this display filter, the chromatic purity of the outgoing light increases by an absorption of the light at the intermediate wavelength included in the outgoing light from each light-emitting pixel.

Patent Literature 3 (Japanese Unexamined Patent Application Publication No. 2003-178879) discloses an organic EL display in which a magenta-colored filter is formed only over red and blue light-emitting pixels.

According to this organic EL display, it is possible to increase chromatic purity in red, blue, and green, and luminance.

Furthermore, Patent Literature 4 (Japanese Unexamined Patent Application Publication No. 2000-21570) discloses an EL display apparatus in which a contrast increasing film for suppressing reduction in contrast due to reflecting external light is provided. Patent Literature 4 discloses specific conditions for transmission spectrum of the contrast increasing film.

SUMMARY OF THE INVENTION

However, in the multicolor light-emitting organic EL display device according to Patent Literature 1, portions of the color filter positioned with each organic EL element has wavelength selectivity suitable for the color of outgoing light. While this allows obtaining high chromatic purity, there is a problem in manufacturing cost. For example, a process for separately painting four different materials, namely, pigments corresponding to color filters for blue, green, red, and a visible light absorbing material corresponding to the black matrix is necessary. As a result, high cost necessary for manufacturing color filters is unavoidable.

The display filter according to Patent Literature 2 has uniform wavelength selectivity at the entire surface. Thus, it is possible to manufacture the display filter at extremely low cost. However, there is a problem that the display filter is not suitable for an organic EL display device having close peak wavelengths of blue light and green light. Absorbing light at the wavelength intermediate between blue and green light in the organic EL display device absorbs light at a useful wavelength, and causes a problem such as a significant reduction in light-emitting efficiency of green at the price of chromatic purity of blue.

The organic EL display according to Patent Literature 3 indeed improves chromatic purity. However, there are problems of extremely high reflectance of external light, and low contrast.

According to the organic EL display device according to Patent Literature 4 using a contrast increasing film, the reduction in contrast due to reflection of external light is suppressed. However, the result of tests performed by the inventors using the transmission spectrum disclosed in Patent Literature 4 shows that there is room for improvement in terms of both contrast and chromatic purity.

Note that, a configuration without color filters is possible. In this case, there is a problem that the chromatic purity of blue is generally low due to organic EL light-emitting material. In order to solve this problem, it is widely known that the optical cavity can improve the chromatic purity. However, with this method, there is a problem that the change in color depending on viewing angle is generally large. Accordingly, with the configuration without the color filters, it is difficult to achieve high display quality capability.

Furthermore, in order to improve the contrast, a method of reducing the reflectance of external light using a polarizer is widely known. However, the polarizer is generally expensive, which is a big problem in terms of cost. Furthermore, with the polarizer, the transmittance of the light emitted from the inside of the device is low, and thus there is a problem of reduced luminance and increased power consumption.

The present invention has been conceived in view of the problems, and it is an object of the present invention to provide a multicolor light-emitting organic EL display device capable of displaying images with high chromatic purity and contrast, and with a configuration suitable for reducing manufacturing cost.

In order to solve the problems above, the multicolor light-emitting organic EL display device according to the present invention is a multicolor light-emitting organic electroluminescent (EL) display device including a plurality of organic EL light-emitting regions each of which emits red light, green light, or blue light and a non light-emitting region that are arranged on a main substrate, the multicolor light-emitting organic EL display device including: a first light-adjusting layer; and a second light-adjusting layer, in which the first light-adjusting layer is a magenta color filter and is laid over a light-emitting region of the blue light, a light-emitting region of the red light, and the non light-emitting region, (the first light-adjusting layer not provided over the light-emitting region of the green light) the second light-adjusting layer is made of resin, selectively absorbs light having a wavelength intermediate between the red light and the green light, and the second light-adjusting layer is laid over the light-emitting region of the blue light, a light-emitting region of the green light, the light-emitting region of the red light, and the non light-emitting region.

Here, it is preferable that the first light-adjusting layer has a maximum value of a transmission factor of visible light being 80% or greater, a minimum value of the transmission factor being 40% or smaller, a wavelength indicating 60% of the transmission factor in ranges between 480 nm and 510 nm and between 560 nm and 590 nm. It is preferable that the second light-adjusting layer has: a maximum value of a transmission factor of visible light being 80% or greater; and a minimum value of the transmission factor being 25% or smaller; a wavelength indicating 60% of transmission factor in ranges between 550 nm and 580 nm and between 590 nm and 620 nm; and a wavelength indicating a minimum value of the transmission factor in a range between 580 nm and 600 nm, Furthermore, in the multicolor light-emitting organic EL display device according to the present invention is A multicolor light-emitting organic electroluminescent (EL) display device including a plurality of organic EL light-emitting regions each of which emits red light, green light, or blue light and a non light-emitting region that are arranged on a main substrate, the multicolor light-emitting organic EL display device including: a first light-adjusting layer; a second light-adjusting layer; and a third light-adjusting layer, in which the first light-adjusting layer is a magenta color filter and is laid over a light-emitting region of the blue light, a light-emitting region of the red light, (the first light-adjusting layer not provided over the light-emitting region of green light and the non light-emitting region) the second light-adjusting layer is made of resin and selectively absorbs light having a wavelength intermediate between the red light and the green light, the second light-adjusting layer is laid over the light-emitting region of the blue light, a light-emitting region of the green light, the light-emitting region of the red light, and the non light-emitting region, and the third light-adjusting layer is laid over the non light-emitting region, and absorbs 90% or more of visible light.

Here, it is preferable that the first light-adjusting layer has a maximum value of a transmission factor of visible light being 80% or greater, a minimum value of the transmission factor being 40% or smaller, a wavelength indicating 60% of the transmission factor in ranges between 480 nm and 510 nm and between 560 nm and 590 nm. It is preferable that the second light-adjusting layer has: a maximum value of a transmission factor of visible light being 80% or greater; a minimum value of the transmission factor being 40% or smaller; a wavelength indicating 60% of transmission factor in ranges between 550 nm and 580 nm and between 590 nm and 620 nm; and a wavelength indicating a minimum value of the transmission factor in a range between 580 nm and 600 nm, The second light-adjusting layer may be formed substantially uniform across the entirety of the multicolor light-emitting organic EL display device.

A wavelength indicating the minimum value of the transmission factor of the first light-adjusting layer may be in a range between 520 nm and 550 nm.

With the configuration described above, the first light-adjusting layer serves as a color filter used for both blue and red, securing the chromatic purity of blue and red. The second light-adjusting layer selectively absorbs a wavelength intermediate between green and red, and thus the transmission factors of blue and red are not significantly reduced. The second light-adjusting layer secures chromatic purity of green and red by absorbing light with wavelengths between green and red. In addition, non-desired external light belonging to the intermediate wavelength and with high luminosity factor (for example, peak wavelength of fluorescent light) is also absorbed. Thus, the reflectance of external light is suppressed, increasing the contrast as a result.

Consequently, by using the first light-adjusting layer and the second light-adjusting layer, it is possible to achieve, at low cost, the light-adjusting capacity equivalent to the case in which the color filters including the color filters in three colors and the black matrix.

The present invention may not only be implemented as the multicolor light-emitting organic EL display device, but also as a method of manufacturing the multicolor light-emitting organic EL display device.

As described above, in the multicolor light-emitting organic EL display device according to the present invention, it is possible to achieve suitable chromaticity of the outgoing light, and light-emission efficiency and to reduce the reflectance of external light by using the first light-adjusting layer laid over the light-emitting region of blue light, the light-emitting region of red light, and non-light emitting region so as to serve as the color filter used both for blue and red, and the second light-adjusting layer selectively absorbs the light in a wavelength intermediate between the red light and the green light, and is laid over the light-emitting region of blue light, the light-emitting region of green light, and the light-emitting region of red light.

Since the first light-adjusting layer is used for both blue and red, the first light-adjusting layer can be formed by one patterning. The second light-adjusting layer may be formed as a substantially uniform non-patterned film. This configuration is suitable for manufacturing at lower cost, compared to the conventional color filters which include the separate color filters for blue, green, and red and the black matrix.

BRIEF DESCRIPTION OF THE DRAWINGS

These and other objects, advantages and features of the invention will become apparent from the following description thereof taken in conjunction with the accompanying drawings that illustrate a specific embodiment of the present invention. In the Drawings.

DESCRIPTION OF THE PREFERRED EMBODIMENTS

The multicolor light-emitting organic electroluminescent (EL) display device according to the present invention (hereafter referred to as an organic EL display device) is a multicolor light-emitting organic EL display device including a plurality of organic EL light-emitting regions each of which emits red light, green light, or blue light that are arranged on a main substrate, and the multicolor light-emitting organic EL display device is characterized by: a magenta color filter as a first light-adjusting layer having predetermined selective transmission property for the blue light and the red light; and a second light-adjusting layer having a selective absorption property for light with a wavelength intermediate between the red light and the green light.

Upon conceiving the present invention, the inventors focus on chromaticity of outgoing light, light-emitting efficiency and reflectance of external light as indicators of display quality capacity of a color organic EL display device. These indicators are determined by an electroluminescence spectrum (EL spectrum) of an organic EL element, and absorption spectrums of the first light-adjusting layer and the second light-adjusting layer.

In terms of color reproducibility, it is preferable that the chromaticity of outgoing light is closer to a chromaticity value indicating a high chromatic purity. In terms of power consumption, higher light-emitting efficiency is preferable. In terms of contrast in bright spot and glare, lower reflectance of external light is preferable.

Furthermore, as a manufacturing cost, the inventors focus on the number of processes for manufacturing the light-adjusting layer.

The smaller number of processes for manufacturing the light-adjusting layer is preferable for reducing the manufacturing cost.

The inventors calculated the chromaticity of the outgoing light, the light-emitting efficiency, and the reflectance of external light based on a number of EL spectrums and absorption spectrums, and after diligent reviews, concluded that the color organic EL device with the configuration described above is capable of displaying images with high chromatic purity and high contrast, and is suitable for reducing the manufacturing cost.

The following shall describe a color organic EL display device according to Embodiment of the present invention with reference to the drawings.

In this embodiment, effectiveness and necessity of the present invention shall be described through comparisons of nine different configurations, that is, the examples 1 to 3 and the comparative examples 1 to 6.

EXAMPLE 1

Figure 1:
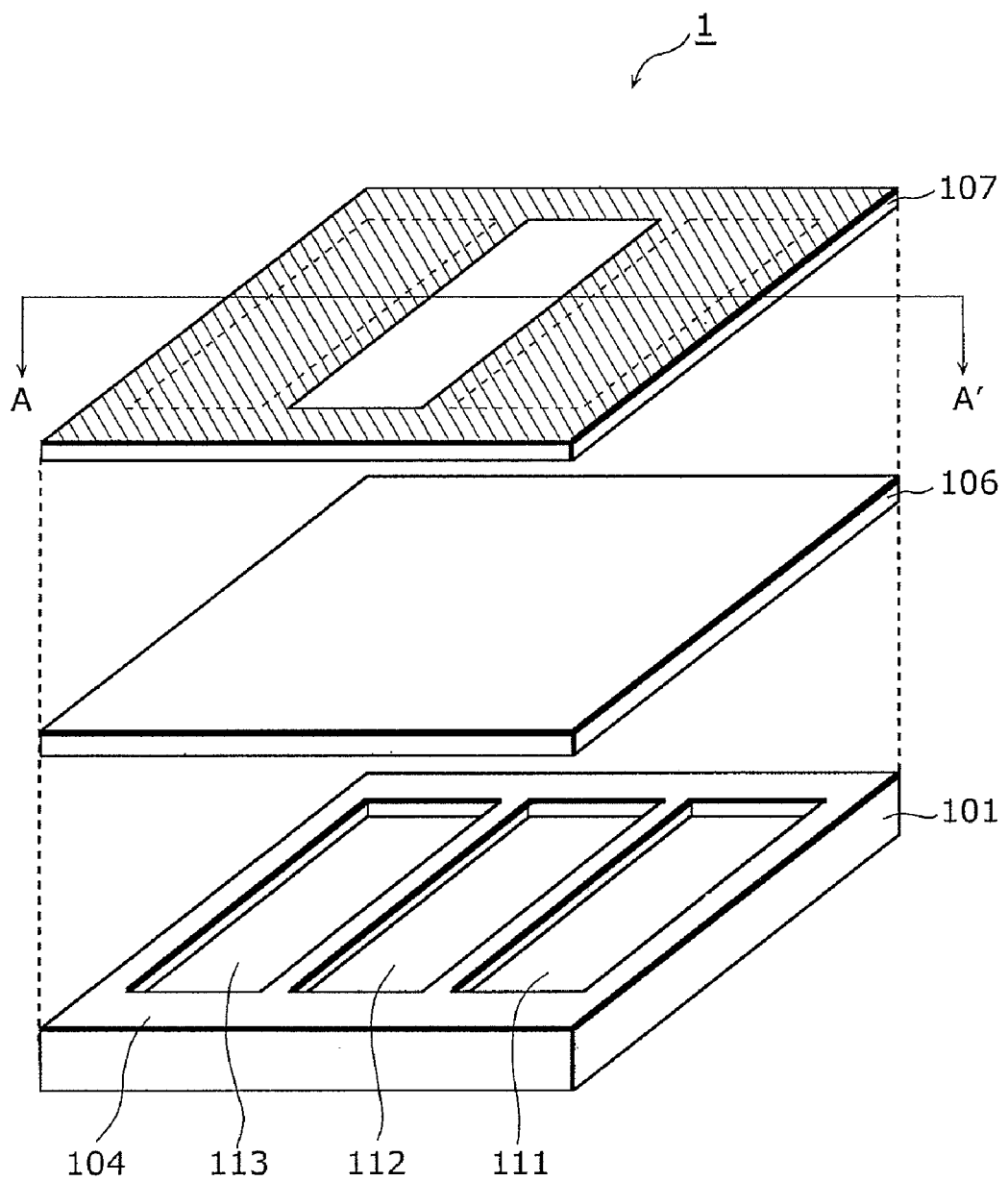
FIG. 1 is an exploded perspective, view illustrating schematic configuration of the pixel unit having light-emitting regions of red light, green light, and blue light as one set.
Figure 18:
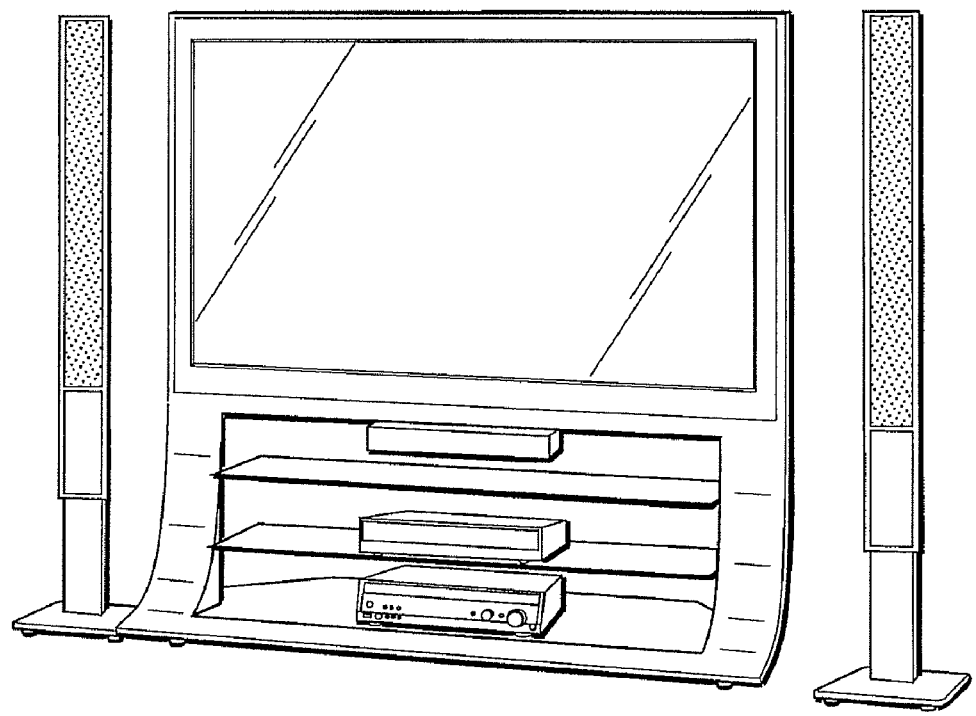
FIG. 18 is an external view of a thin flat television incorporating the organic EL display device according to the present invention.

FIG. 1 is an exploded perspective view illustrating a pixel unit of the organic EL display device 1 according to the example 1 of the present invention. The pixel unit has light-emitting regions of red light, green light, and blue light as one set. The organic EL display device according to the present invention may be used as a display device configuring a thin flat television as illustrated in FIG. 18, for example.

Figure 2:
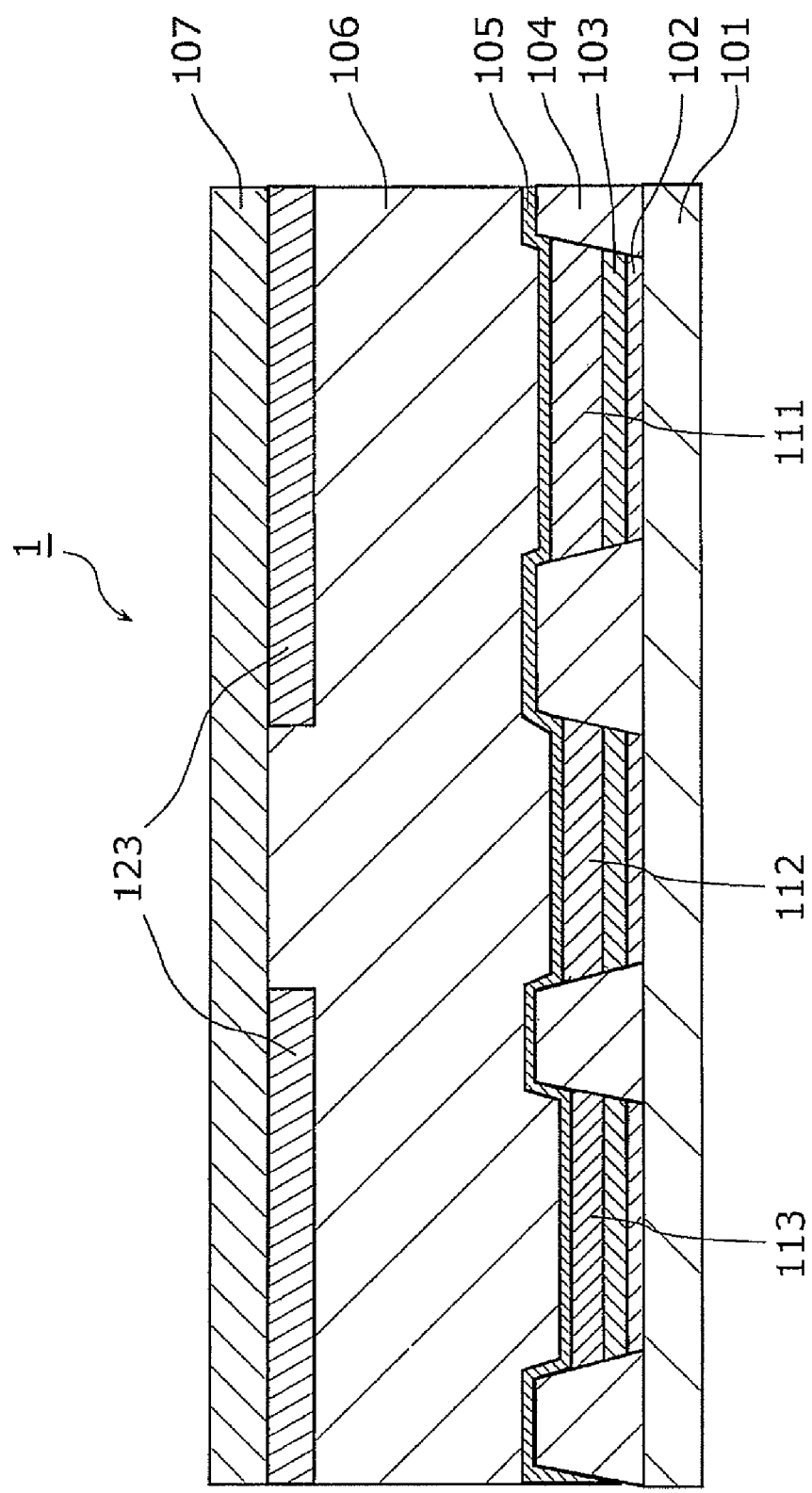
FIG. 2 is a cross-sectional view illustrating schematic configuration of main part of the organic EL display device according to the example 1 of an embodiment of the present invention.

FIG. 2 is a cross-sectional view illustrating A-A' cross-section of the organic EL display device 1.

The organic EL display device 1 is configured by bonding a main substrate 101 and a sub substrate 107 using a second light-adjusting layer 106. The main substrate 101 includes a red-light emitting layer 111, a green-light emitting layer 112, and a blue-light emitting layer 113, which are light-emitting regions for red light, green light, and blue light, respectively, and a bank 104 which is a non-light emitting region. A first light-adjusting layer is formed on the sub substrate 107.

The first light-adjusting layer is laid over the blue-light emitting layer 113, the red-light emitting layer 111, and the banks 104 (the part illustrated in oblique lines in FIG. 1), and has a magenta color filter which absorbs visible light other than desired blue light and desired red light.

Next, with reference to FIG. 2, a method of manufacturing the organic EL display device 1 shall be described.

In this example, the description is made using a top-emission organic EL display device as an example to describe the organic EL display device 1. However, a bottom-emission organic EL display device can be manufactured based on the same idea and the same effects can be achieved.

First, the main substrate 101 is prepared. On the main substrate 101, a driving circuit including a transistor array and others which are conventionally known for an active matrix display device is formed.

Next, a reflexible anode 102 is formed, and is subsequently patterned into a predetermined shape. The material of the anode 102 is not particularly limited, and may be aluminum, silver, chromium, nickel, for example. In terms of light-emitting efficiency, a material with high reflectance can be suitably used. The anode 102 may be a multi-layered structure, and may be a structure including Indium Tin Oxide (ITO) formed on aluminum.

Next, the bank 104 is formed, and patterning is performed such that an upper part of the anode 102 is exposed. The material of the bank 104 is not particularly limited, and an insulating and photosensitive resin is used, for example. The film-forming method and the patterning method are not particularly limited either. For example, after forming the entire surface by a wet process, patterning using the photolithography may be performed.

Next, a hole transport layer 103 is formed. The material for the hole transport layer 103 is not particularly limited. As an example, it may be a small-molecules material, a polymeric material, or a mixture of these materials. In general, Triarylamine derivative is preferably used. Furthermore, the method of forming the hole transport layer 103 is not particularly limited either, and it may be a wet process such as the ink-jet, or a dry process such as the vapor deposition.

Next, the red-light emitting layer 111, the green-light emitting layer 112, and the blue-light emitting layer 113 are formed. The luminescent material used for the red-light emitting layer 111, the green-light emitting layer 112, and the blue-light emitting layer 113 may be a small-molecules material, a polymeric material, or the mixture of these materials. It is necessary for the luminescent materials to emit light with a chromaticity relatively close to a preferred chromaticity of the outgoing light. The generated spectrum from the luminescent materials and the chromaticity of the outgoing light after a color correction by the light-adjusting layer shall be described later in detail.

Next, the cathode 105 is formed. The cathode 105 has an electron injecting property, and can also serve as an electron injecting layer. Although the structure of the cathode 105 is not particularly limited, it is necessary for the cathode 105 to have a relatively high transmittance of visible light when the organic EL display device is of the top-emission type. For example, a stacked structure of Lithium Fluoride, Magnesium, and an alloy of Silver may be used.

Individual from the manufacturing process described above, the sub substrate 107 having the first light-adjusting layer 109 composed of a magenta color filter for increasing the purity of blue and red is manufactured. The sub substrate 107 is, for example, a glass substrate or a plastic substrate.

The first light-adjusting layer is composed of a magenta color filter 123 made of the same material integrally formed, positioned with the blue-light emitting layer 113, the red-light emitting layer 111, and the non-light emitting region. Here, the non-light emitting region is where the bank 104 exists, and does not emit any light since the region is electrically insulated.

The magenta color filter 123 increases the purity of blue and red by selectively transmitting the desired blue light included in the light emitted from the blue-light emitting layer 113 and the desired red light included in the light emitted from the red-light emitting layer 111. In addition, the magenta color filter 123 improves the contrast of the display image by absorbing, above the bank 104, visible light included in the external light other than the desired blue light and the desired red light.

Although the material for the magenta color filter is not particularly limited, a resin with dispersed pigment or dye may be suitably used. For example, a condensed azo compound, a diketo-pyrrolo-pyrrole compound, an anthraquinone compound, quinacridone, a naphtol compound, a benzimidazolon compound, a thioindigo compound, a perylene compound, and others may be used. For example, C. I. pigments red 2, 3, 5, 6, 7, 23, 48:3, 48:4, 57:1, 81:1, 144, 146, 166, 169, 177, 184, 185, 202, 206, 220, 221, 254, and others may be used. The absorption spectrum of the magenta color filter 123 is important, and it is necessary to increase the purity of blue using a short-wavelength side of the absorption spectrum, that is, a spectral shape in the proximity of 470 to 550 nm, and to secure a transmission factor of red using a long-wavelength side of the absorption spectrum, that is, a spectral shape of 550 nm or higher. The relationship between the absorption spectrum and the light-emission spectrum shall be described later.

Figure 3:
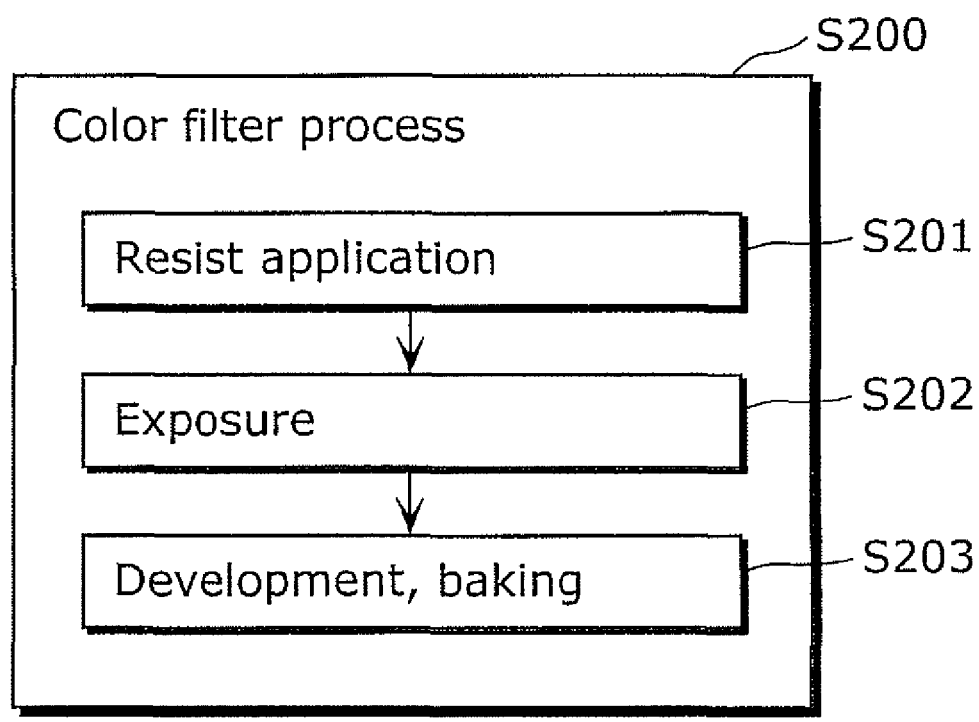
FIG. 3 is a diagram illustrating a process of manufacturing a first light-adjusting layer in the example 1 of the embodiment of the present invention.

Although the method of manufacturing the magenta color filter 123 on the sub substrate 107 is not particularly limited, the magenta color filter 123 may be manufactured according to a general process illustrated in FIG. 3, for example.

In the color filter process illustrated in FIG. 3 (S200), first, a color resist which is a photosensitive resin is, for example, spin coated on the sub substrate 107, and pre-baking is performed (S201). Next, a predetermined photo mask is firmly attached on a resist, and the pattern is exposed by ultraviolet light (S202). With this, a predetermined region of the resist is hardened and becomes insoluble. After that, a part of the color resist that is not insoluble is removed using developing fluid, and post-baking is performed. With this, a color filter having a predetermined pattern is obtained (S203).

Finally, the sub substrate 107 supporting the first light-adjusting layer and the main substrate 101 supporting the organic EL light-emitting region are bonded by the second light-adjusting layer 106.

Although the method of bonding is not particularly limited, for example, the pigments are dispersed in photo-curable resin, and the main substrate 101 and the sub substrate 107 are bonded by the resin. After that, the resin is fixed by irradiating light. Here, as illustrated in FIG. 2, it is necessary to position the magenta color filter 123 with the blue-light emitting layer 113, the red-light emitting layer 111, and the banks 104.

The absorption spectrum of the second light-adjusting layer 106 is important, and it is necessary for the second light-adjusting layer 106 to have a spectral shape allowing both absorption of non-desired external light with high luminosity factor, and transmission of the green light emitted form the green-light emitting layer 112. The relationship between the absorption spectrum and the chromaticity of outgoing light shall be described later in detail.

EXAMPLE 2

Although the organic EL light-emitting region in the organic EL display device in the example 2 is formed in the same manner as the organic EL display device according to the example 1, the organic EL display device according to the example 2 is different from the organic EL display apparatus according to the example 1 in that a third light-adjusting layer (black matrix) is included, and that the absorption spectrum of the second light-adjusting layer is different.

Figure 4:
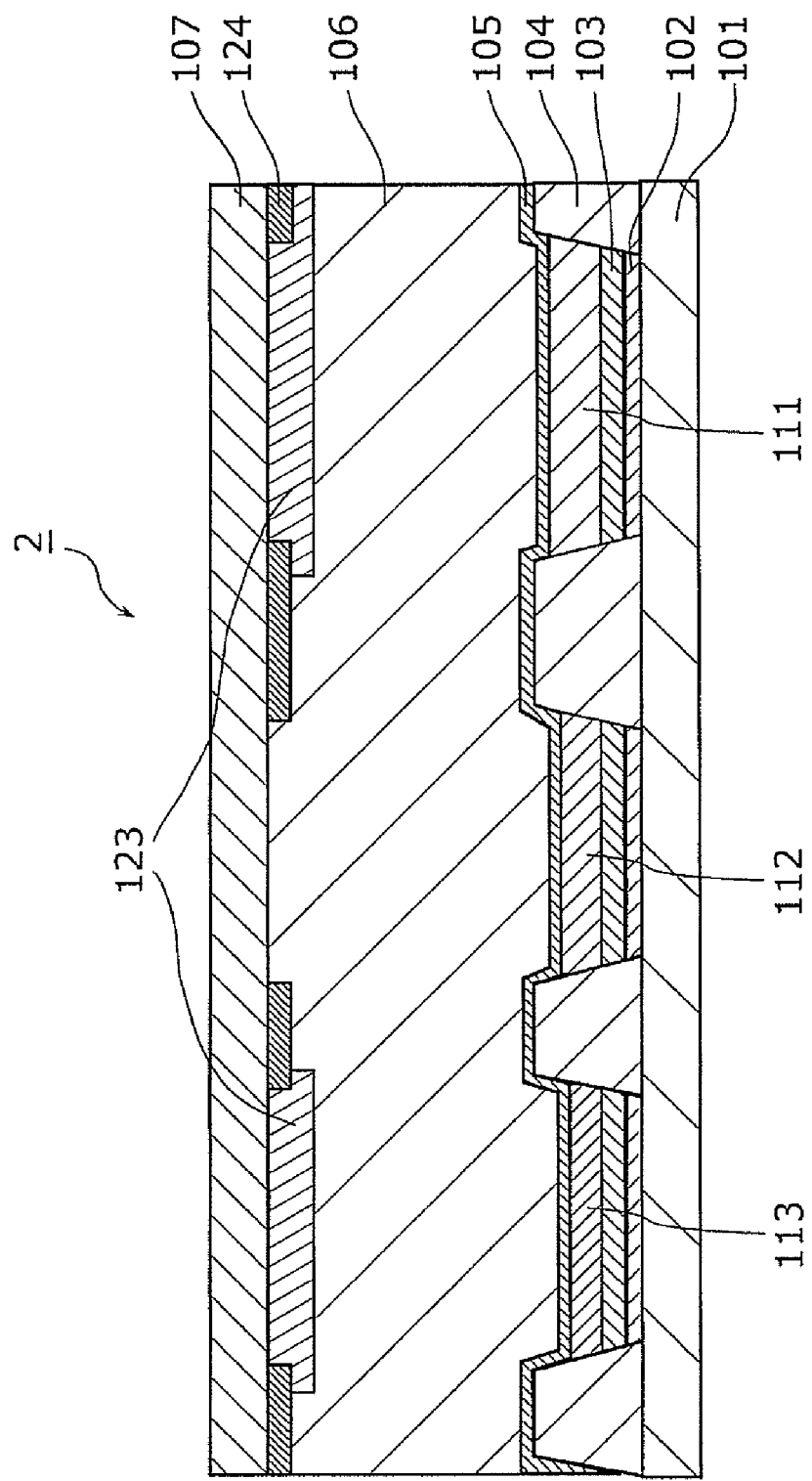
FIG. 4 is a cross-sectional view illustrating schematic configuration of main part of the organic EL display device according to the example 2 of the embodiment of the present invention.

FIG. 4 is a cross-sectional view illustrating an example of configuration of the organic EL display device 2 according to the example 2, and corresponds to the A-A' cross section of the organic EL display device 1 in FIG. 1. The first light-adjusting layer in the organic EL display device 2 is manufactured as follows.

Independent from the process for manufacturing the organic EL light-emitting region on the main substrate 101, the sub substrate 107 having the first light-adjusting layer is manufactured. The sub substrate 107 is, for example, a glass substrate or a plastic substrate.

The first light-adjusting layer is formed positioned with the blue-light emitting layer 113 and the red-light emitting layer 111, and is composed of a magenta color filter 123 which selectively transmits the desired blue light and the desired red light. The black matrix (third light-adjusting layer) 124 is formed positioned with the non-light emitting region, and absorbs the entire visible light range. Here, the non-light emitting region is where the bank 104 exists, and does not emit any light since the region is electrically insulated.

The magenta color filter 123 increases the purity of blue and red by selectively transmitting the desired blue light included in the light emitted from the blue-light emitting layer 113 and the desired red light included in the light emitted from the red-light emitting layer 111. In addition, the magenta color filter 123 improves the contrast of the display image by absorbing, above the bank 104, visible light included in the external light other than the desired blue light and the desired red light.

The black matrix (third light-adjusting layer) 124 has an absorptance of 90% or higher (preferably almost 100%) in the entire visible light range, and improves the contrast of display image by absorbing external light. Although the material of the black matrix 124 is not particularly limited, chrome or a resin with dispersed pigment or dye may be preferably used.

Figure 5:
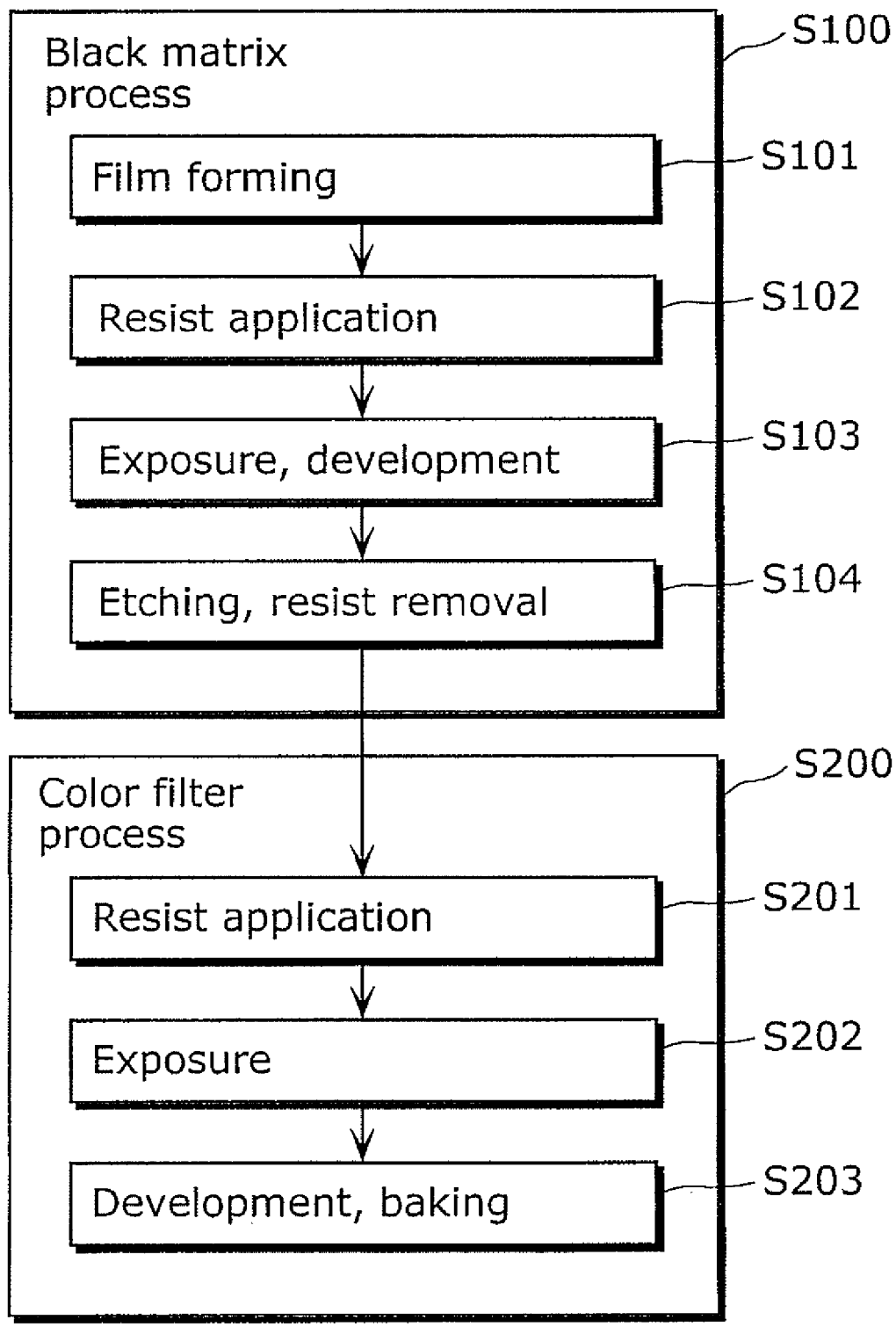
FIG. 5 is a diagram illustrating a process of manufacturing a first light-adjusting layer in the example 2 of the embodiment of the present invention.

Although the method of manufacturing the magenta color filter 123 and the black matrix 124 on the sub substrate 107 is not particularly limited, the magenta color filter 123 and the black matrix 124 may be manufactured according to a general process illustrated in FIG. 5, for example.

The process illustrated in FIG. 5 generally includes a black matrix process (S100) and a color filter process (S200).

In the black matrix process (S100), after forming a chromium film by sputter deposition or others (S101), a photo resist is applied (S102) and exposure and development is performed using a photo mask (S103), according to a generally photolithography. Subsequently, etching and resist removal are performed, obtaining the black matrix with a preferred pattern (S104). Since the subsequent color filter process (S200) is identical to the detail illustrated in FIG. 3, the description for the color filter process shall be omitted.

Finally, the sub substrate 107 supporting the first light-adjusting layer and the main substrate 101 supporting the organic EL light-emitting portion are bonded by the second light-adjusting layer 106.

Although the method of bonding is not particularly limited, for example, the pigments are dispersed in photo-curable resin, and the main substrate 101 and the sub substrate 107 are bonded by the resin. After that, the resin is fixed by irradiating light. Here, as illustrated in FIG. 4, it is necessary to position the black matrix 124 and the banks 104.

EXAMPLE 3

Compared to the example 1, the organic EL display device according to the example 3 has the same configuration and manufacturing method, but has different absorption spectrums of the first light-adjusting layer and the second light-adjusting layer. The absorption spectrum of the first light-adjusting layer and the absorption spectrum of the second light-adjusting layer used for the examples 1 to 3 shall be described later.

Next, the organic EL display device according to the comparative examples 1 to 6 shall be described. The organic EL display devices according to the comparative examples 1 to 6 are configured modifying part of the organic EL display devices according to the examples 1 to 3, for comparisons with the examples 1 to 3.

COMPARATIVE EXAMPLE 1

An organic EL display device according to the comparative example 1 is identical to the organic EL display device according to the example 1 in its configuration and manufacturing method except that the first light-adjusting layer and the second light-adjusting layer are omitted.

COMPARATIVE EXAMPLE 2

An organic EL display device according to the comparative example 2 is identical to the organic EL display device according to the example 1 in its configuration and manufacturing method except that the second light-adjusting layer is omitted.

COMPARATIVE EXAMPLE 3

An organic EL display device according to the comparative example 3 is identical to the organic EL display device according to the example 1 in its configuration and manufacturing method except that the first light-adjusting layer is omitted.

COMPARATIVE EXAMPLE 4

An organic EL display device according to the comparative example 4 is identical to the organic EL display device according to the example 2 in its configuration and manufacturing method except that the second light-adjusting layer is omitted.

COMPARATIVE EXAMPLE 5

An organic EL display device according to the comparative example 5 is identical to the organic EL display device according to the example 1 in its configuration and manufacturing method except that a blue color filter, a green color filter, a red color filter are separately provided as the first light-adjusting layer positioned with the blue-light emitting layer, the green-light emitting layer, and the red-light emitting layer, respectively. In addition, in the organic EL display device, the black matrix is further provided, and the second light-adjusting layer is omitted.

COMPARATIVE EXAMPLE 6

The organic EL display device according to the comparative example 6 is identical to the organic EL display device according to the example 1 in its configuration and manufacturing method except that absorption spectrum of the second light-adjusting layer is different.

Among these comparative examples, in the comparative example 5, in particular, three types of color filters, namely, the color filters in red, green, and blue are provided as the first light-adjusting layer, and the black matrix is also provided. Thus, as described in the related art and the technical problem, the manufacturing cost increases despite the good choromaticity, light-emission efficiency, and external light reflection property.

Figure 6:
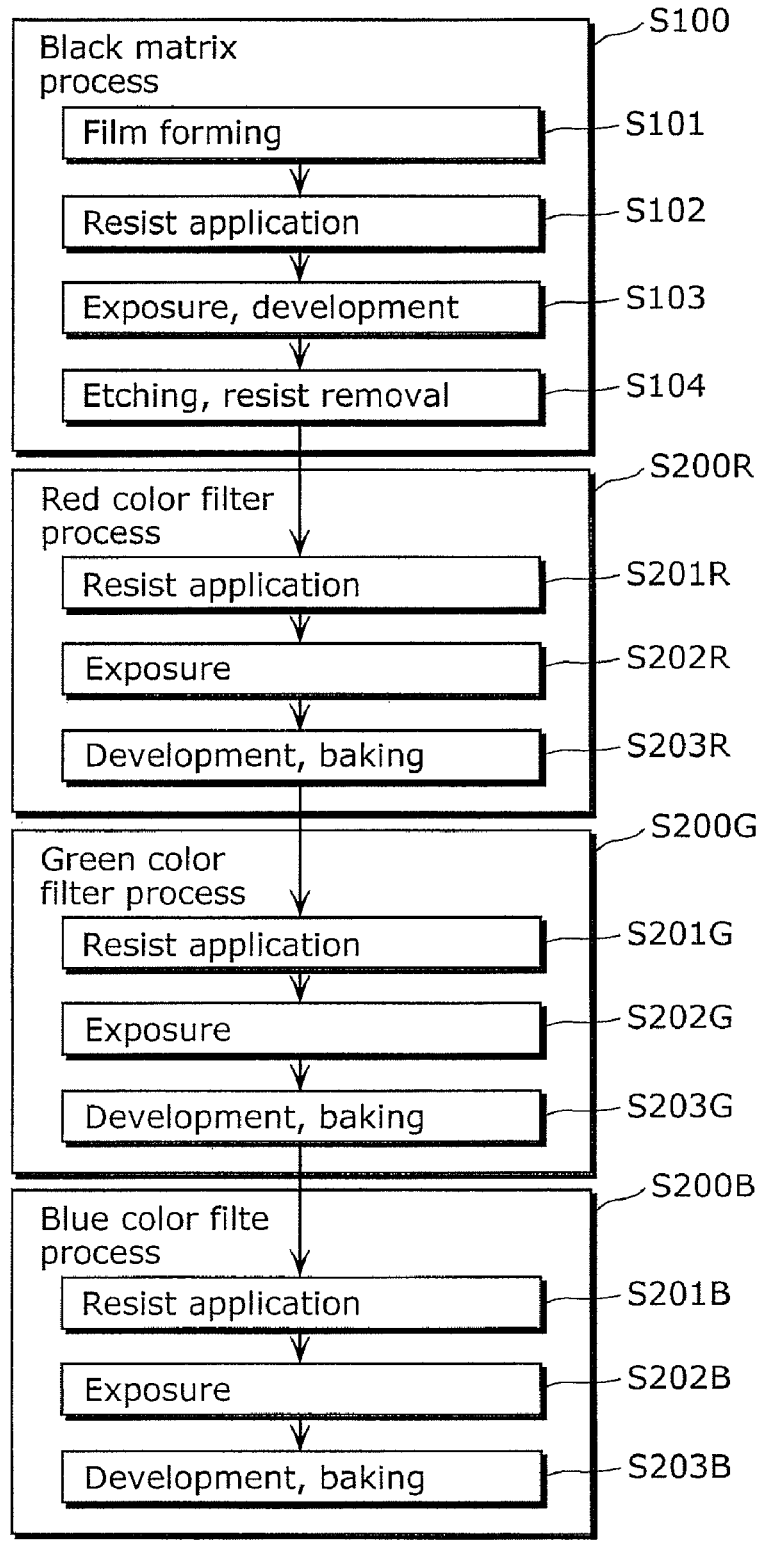
FIG. 6 is a diagram illustrating a manufacturing process for color filters in three colors used for the comparative example 5 for the present invention.

The sub substrate 107 having the first light-adjusting layer in the comparative example 5 can be manufactured, for example, according to the process illustrated in FIG. 6. The process illustrated in FIG. 6 includes a black matrix process (S100) and the color filter processes (S200R, S200G, S200B) as many as the number of colors.

Since the details of the black matrix process (S100) and each color process (S200R, S200G, S200B) are identical to the black matrix process (S100) in FIG. 5 and the color filter process (S200) in FIG. 3, respectively, the description shall be omitted. Note that, the order of the color filter processes in red, green, and blue are merely an example, and the order is not limited to this order.

In the configuration illustrated in the comparative example 5, the three color filter processes are necessary corresponding to each color of red, green, or blue. Thus, it is clear that the manufacturing cost increases compared to the processes illustrated in FIGS. 3 and 5.

Next, spectrums used for basis of consideration shall be described.

Figure 7:
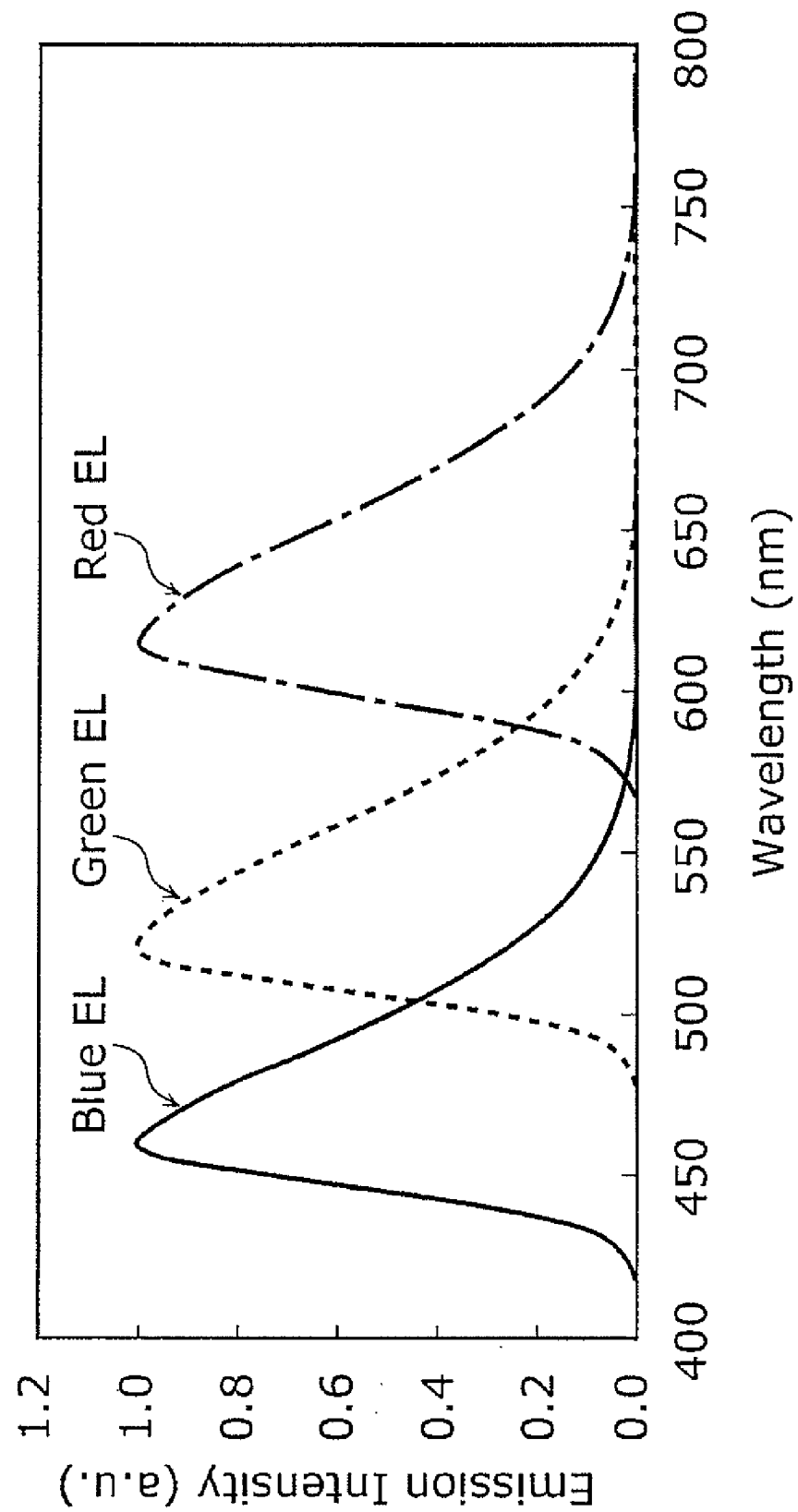
FIG. 7 is a graph indicating EL spectrums in red, green, blue used for the examples 1 to 3 and the comparative examples 1 to 6.

FIG. 7 is a graph illustrating spectrums of light emitted by red, green, and blue luminescent materials (hereafter referred to as EL spectrums) used for the examples 1 to 3, and the comparative examples 1 to 6. These are spectrums before transmitting through the first light-adjusting layer and the second light-adjusting layer.

These spectrums are typical as shapes of spectrums of light emitted from the organic EL, and are reproduced by using a function similar to the normal distribution function.

Figure 8:
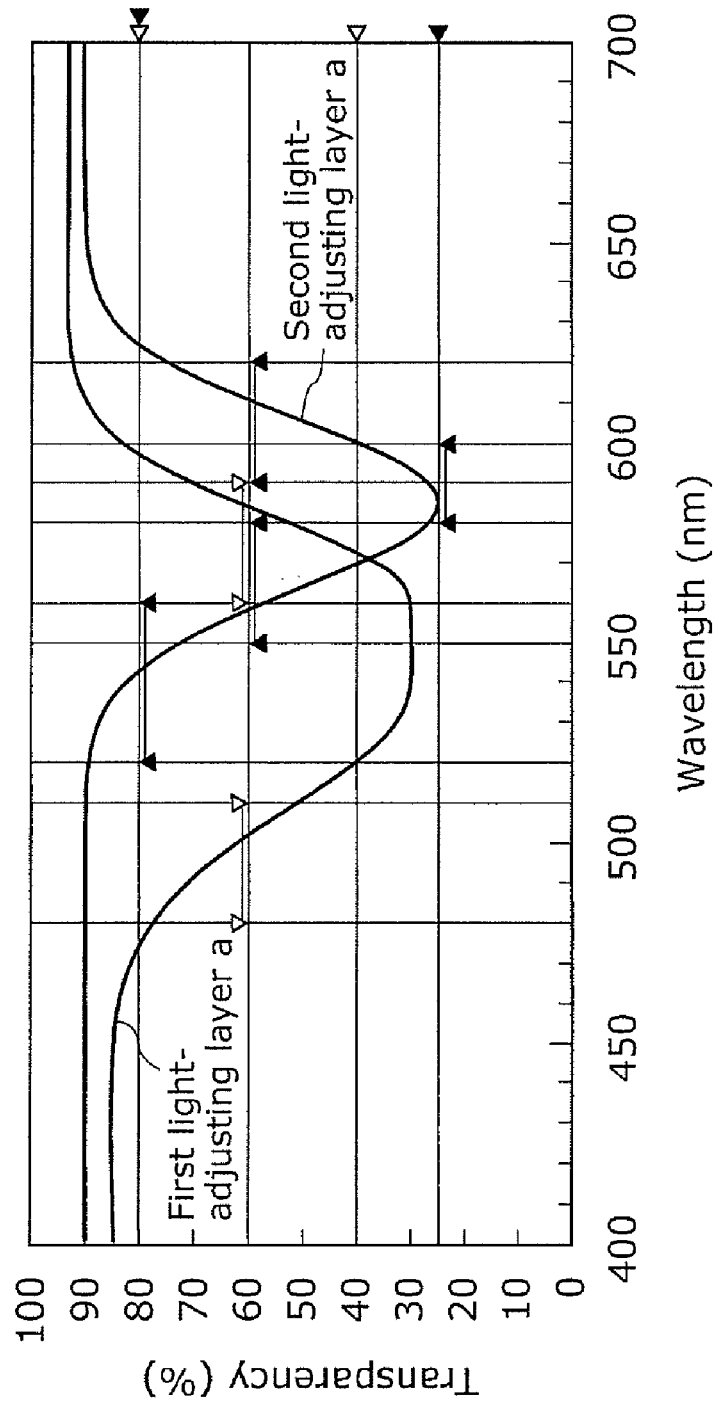
FIG. 8 is a graph indicating absorption spectrums of the first light-adjusting layer and the second light-adjusting layer a used for the example 1 and the comparative examples 2 and 3.

FIG. 8 is a graph illustrating an absorption spectrum of the first light-adjusting layer a used for the example 1 and the comparative examples 2, 4, and 6, and an absorption spectrum of the second light-adjusting layer a used for the example 1 and the comparative example 3. These are reproduced by using a function similar to the normal distribution function.

The absorption spectrum of the first light-adjusting layer a illustrated in FIG. 8 satisfies the following condition 1 defined in the present invention, and the absorption spectrum of the second light-adjusting layer a illustrated in FIG. 8 satisfies the following condition 2 and the condition 4 defined in the present invention.

(Condition 1 Applied to First Light-Adjusting Layer)

The first light-adjusting layer has a maximum value of a transmission factor of visible light being 80% or greater, a minimum value of the transmission factor being 40% or smaller, and a wavelength indicating 60% of the transmission factor in ranges between 480 nm and 510 nm and between 560 nm and 590 nm.

(Condition 2 Applied to Second Light-Adjusting Layer)

The second light-adjusting layer has: a maximum value of a transmission factor of visible light being 80% or greater; and a minimum value of the transmission factor being 25% or smaller; a wavelength indicating 60% of transmission factor in ranges between 550 nm and 580 nm and between 590 nm and 620 nm; and a wavelength indicating a minimum value of the transmission factor in a range between 580 nm and 600 nm, (Condition 4 Applied to Second Light-Adjusting Layer)

The second light-adjusting layer has the transmission factor of 80% or greater in at least part of a wavelength range between 520 nm and 560 nm.

Figure 9:
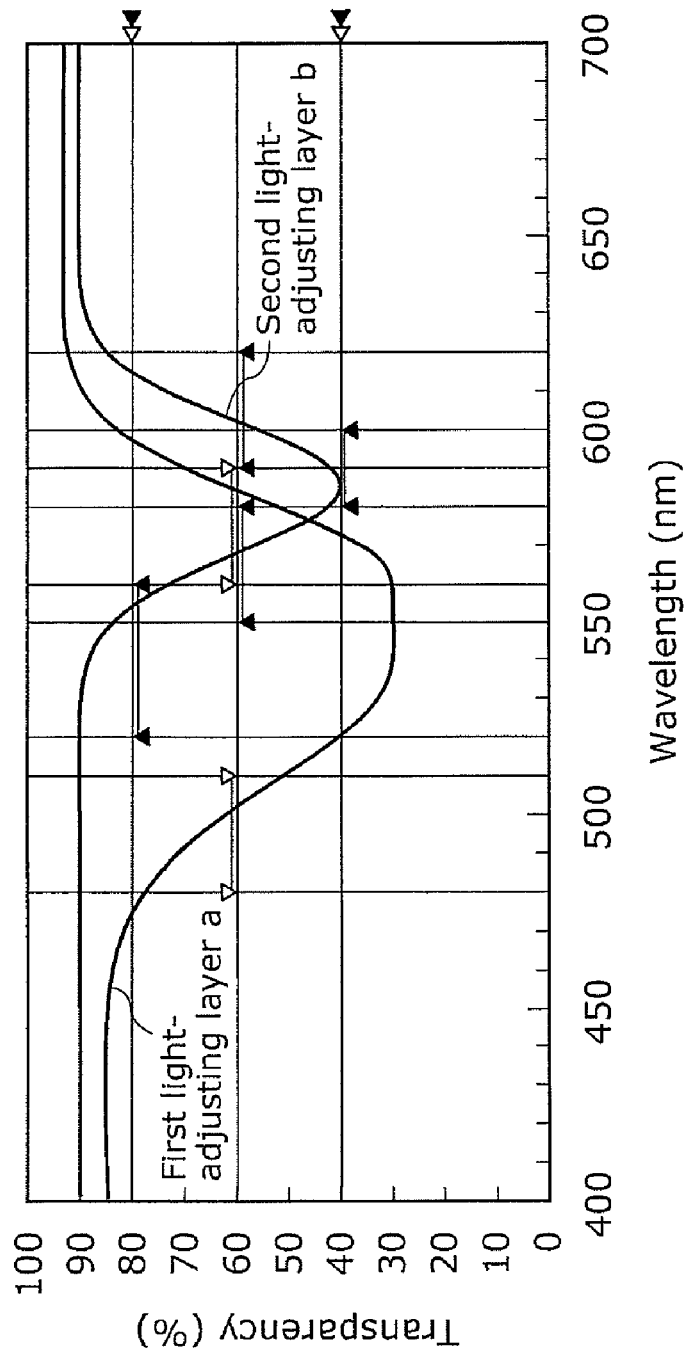
FIG. 9 is a graph indicating absorption spectrums of the first light-adjusting layer a and the second light-adjusting layer b in the example 2 and the comparative example 4.

FIG. 9 is a graph illustrating the absorption spectrum of the first light-adjusting layer a and the absorption spectrum of the second light-adjusting layer b used for the example 2. These are reproduced by using a function similar to the normal distribution function.

The absorption spectrum a in the first light-adjusting layer in FIG. 9 is the absorption spectrum of the first light-adjusting layer a illustrated in FIG. 8, and satisfies the condition 1.

Furthermore, the absorption spectrum of the second light-adjusting layer b illustrated in FIG. 9 satisfies the following condition 3 and the condition 4 defined in the present invention.

(Condition 3 Applied to Second Light-Adjusting Layer)

The second light-adjusting layer has: a maximum value of a transmission factor of visible light being 80% or greater; a minimum value of the transmission factor being 40% or smaller; a wavelength indicating 60% of transmission factor in ranges between 550 nm and 580 nm and between 590 nm and 620 nm; and a wavelength indicating a minimum value of the transmission factor in a range between 580 nm and 600 nm, Note that, the condition 3 is different from the condition 2 only in that a minimum value of the transmission factor of visible light is larger.

Figure 10:
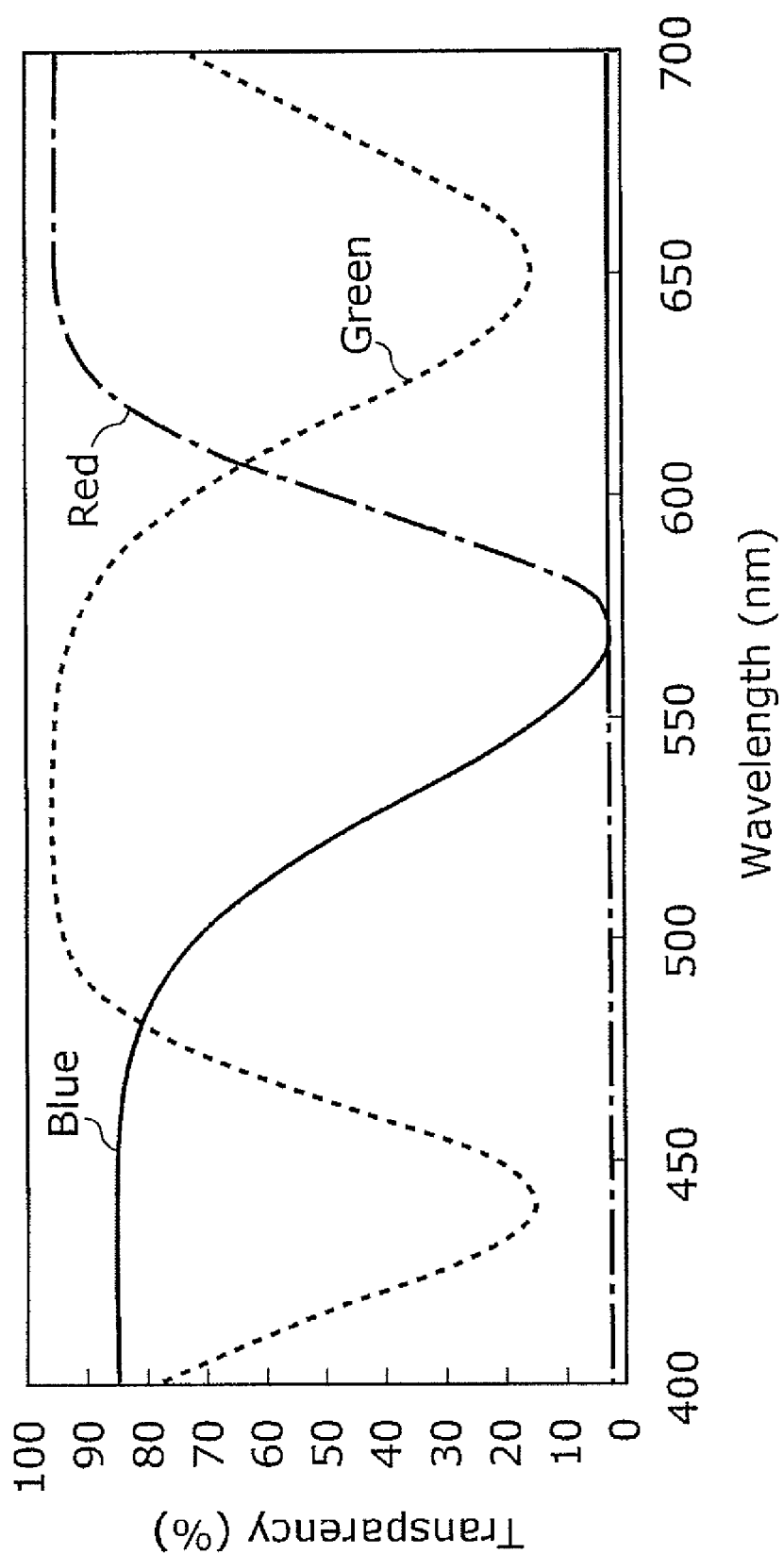
FIG. 10 is a graph indicating absorption spectrums of the color filters in three colors in the comparative example 5.

FIG. 10 is a graph illustrating the absorption spectrums of red, green, and blue in the filters in three colors, that is, the first light-adjusting layer used for the comparative example 5. These are typical as shape of the absorption spectrums of color filters for LCD or the organic EL display device, and are reproduced by using a function similar to the normal distribution function.

Figure 11:
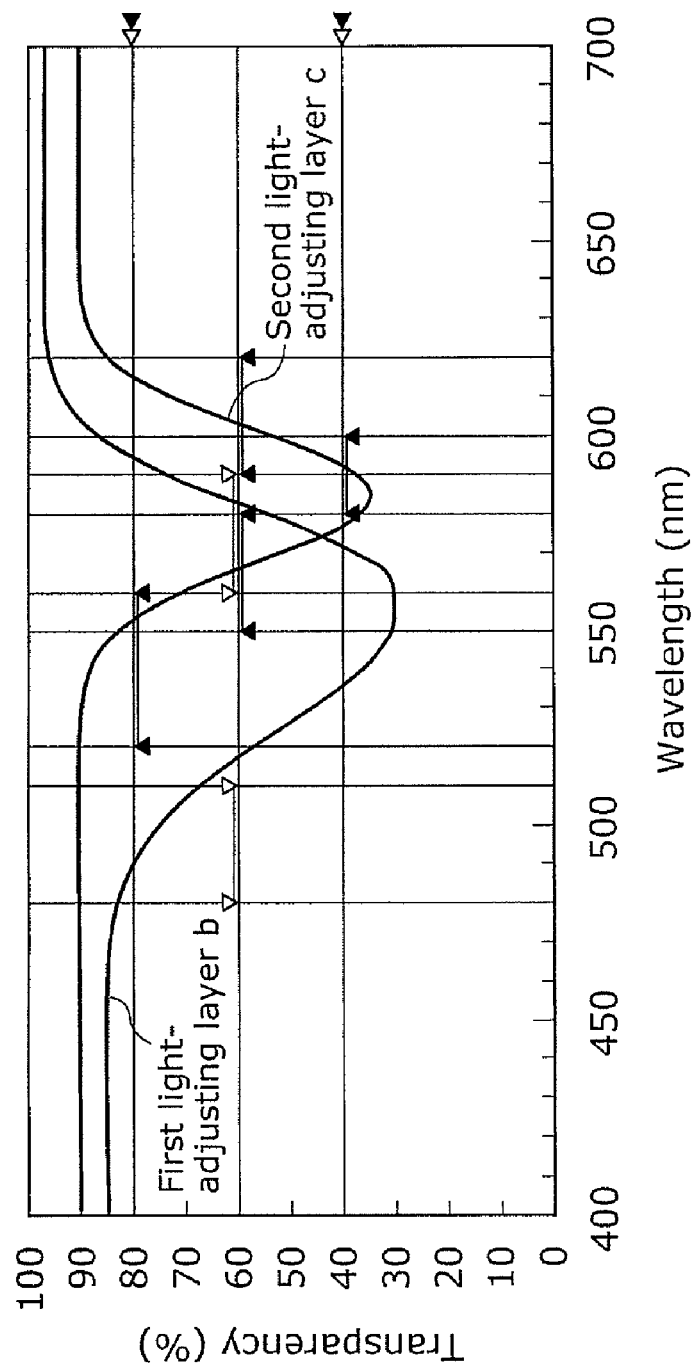
FIG. 11 is a graph indicating absorption spectrums of the first light-adjusting layer b and the second light-adjusting layer c in the example 3.

FIG. 11 is a graph illustrating the absorption spectrum of the first light-adjusting layer b and the absorption spectrum of the second light-adjusting layer c used for the example 3. These are represented by using a function similar to the normal distribution function.

The absorption spectral shape of the first light-adjusting layer b illustrated in FIG. 11 does not satisfy the condition 1 since the wavelength on the left side indicating 60% of transmission factor is 517 nm. The absorption spectral shape of the second light-adjusting layer illustrated in FIG. 11 satisfies the conditions 3 and 4. However, since the minimum of the transmission factor is over 25%, the condition 2 is not satisfied.

Figure 12:
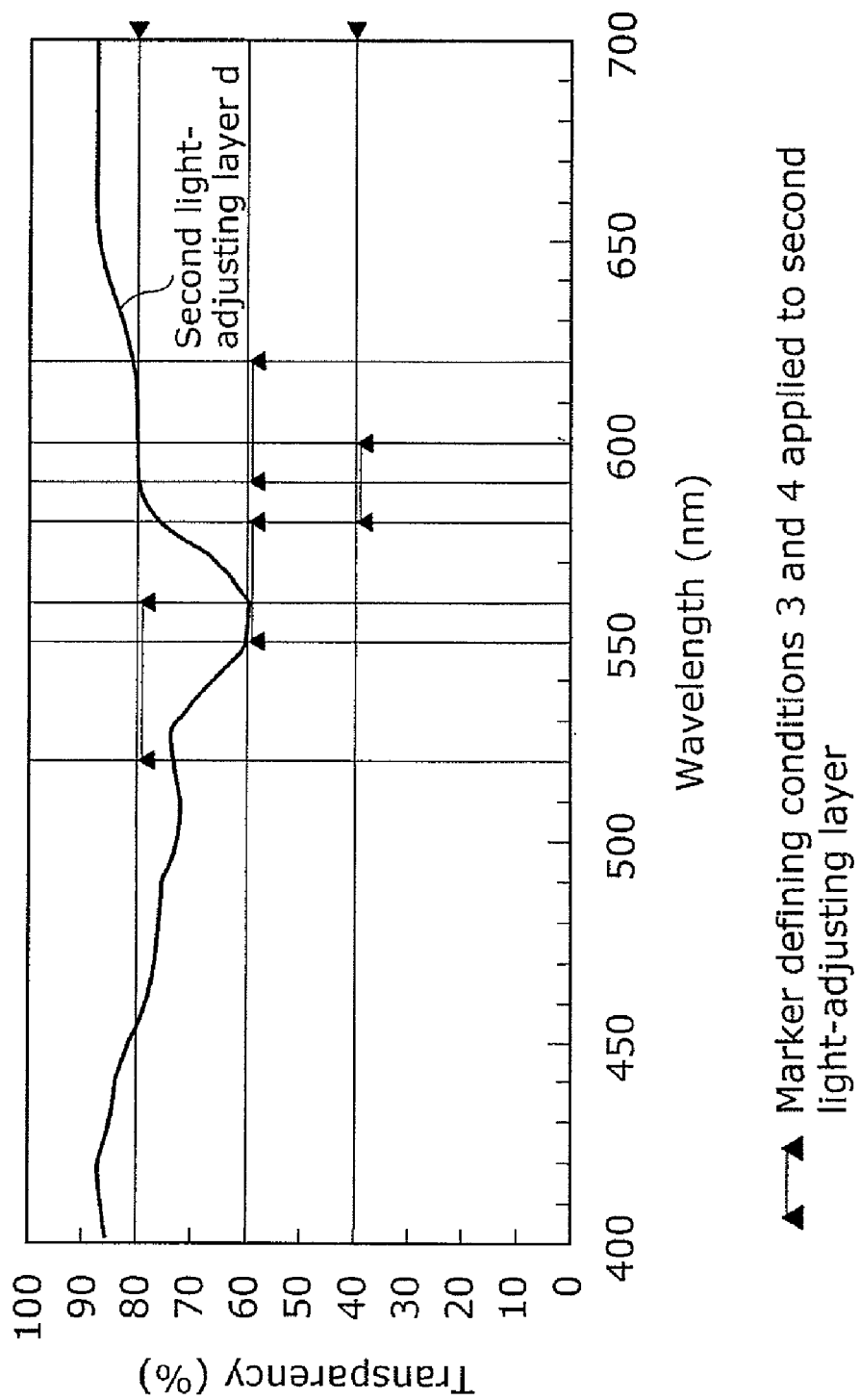
FIG. 12 is a graph indicating an absorption spectrum of the second light-adjusting layer d in the comparative example 6.

FIG. 12 is a graph illustrating the absorption spectrum of the second light-adjusting layer d used for the comparative example 6. The absorption spectrum is identical to the absorption spectrum of the contrast increasing film disclosed in the patent literature 4.

The absorption spectral shape of the second light-adjusting layer d illustrated in FIG. 12 does not satisfy any of the conditions 2 to 4.

Figure 13:
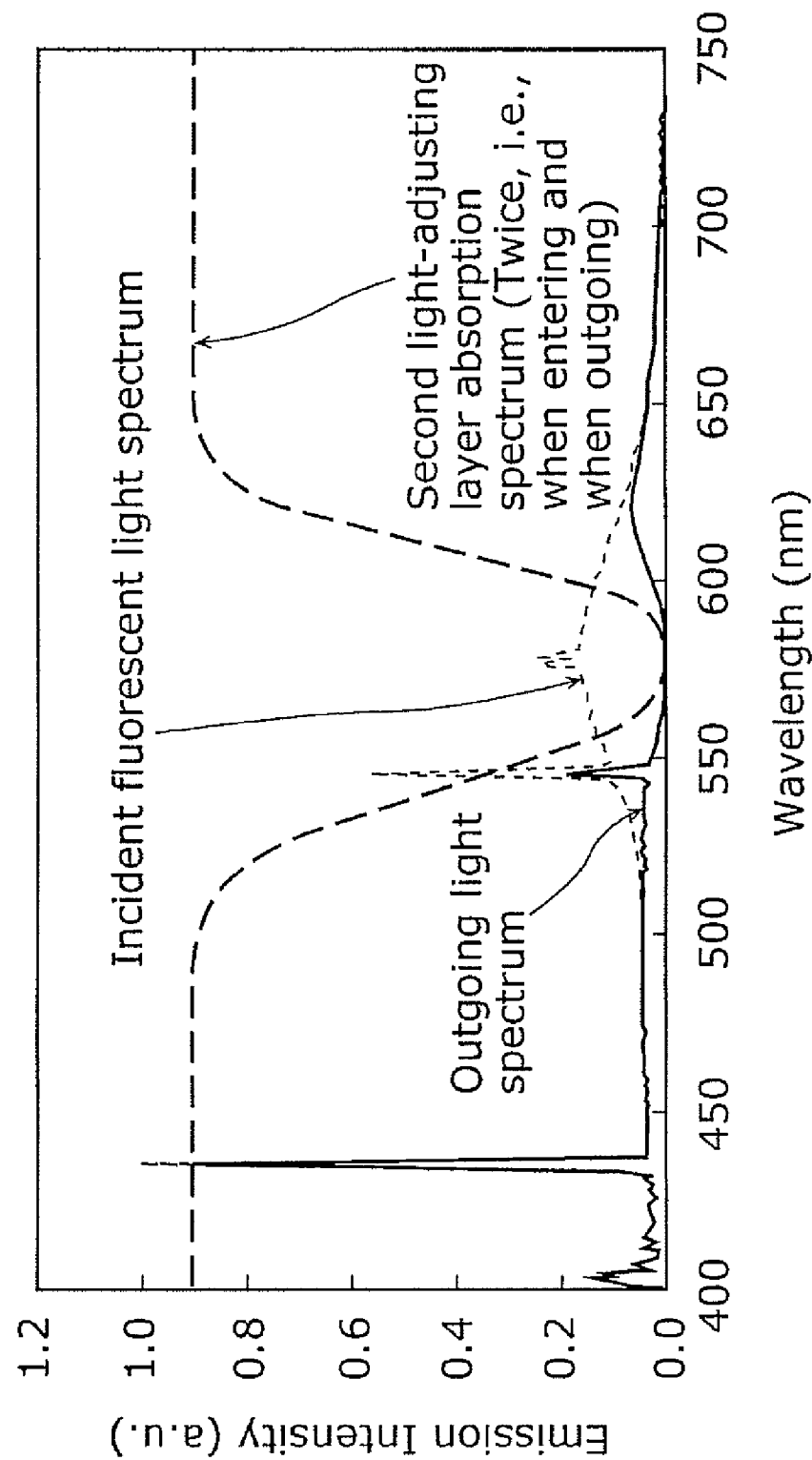
FIG. 13 is a graph illustrating a spectrum of fluorescent light for calculating reflectance of external light, the absorption spectrum when the light passes the second light-adjusting layer twice, and a spectrum of fluorescent light after the transmission in the examples 1 to 3 and the comparative examples 1 to 6.

FIG. 13 is a graph illustrating spectrums of fluorescent light used for calculating the reflectance of external light in the examples 1 to 3, and the comparative examples 1 to 6. For reference, the absorption spectrum when the light transmits the second light-adjusting layer twice, and the spectrum of the fluorescent light are illustrated together.

Using these spectrums as a basis, the chromaticity of the outgoing light in red, green, and blue, a luminance ratio of red, green, and blue outgoing light (assuming that the comparative example 1 is 100%), and the reflectance of external light (assuming that the comparative example 1 is 100%) in Examples and the comparative examples 1 to 5 are calculated.

The table 1 indicates the calculation results, configuration, and the number of processes necessary for forming the light-adjusting layers in the examples 1 to 3, and the comparative examples 1 to 6. In addition, the table 2 shows the spectrum characteristics of the first light-adjusting layer and the second light-adjusting layer used in the examples 1 to 3.

TABLE 1

| Configuration* | Chromaticity (CIE color coordinates) | | | Luminance ratio (%) | | | Reflectance of external light (%) | Number of film-forming processes |
|---|---|---|---|---|---|---|---|---|
| | Red | Green | Blue | Red | Green | Blue | | |
| (Example 1) First light-adjusting layer a, Second light-adjusting layer a | (0.69, 0.31) | (0.25, 0.69) | (0.13, 0.12) | 54 | 71 | 46 | 15 | Color filter × 1 |
| (Example 2) First light-adjusting layer a, BM, Second light-adjusting layer b | (0.68, 0.32) | (0.27, 0.68) | (0.13, 0.12) | 63 | 79 | 47 | 13 | Color filter × 1 Black matrix × 1 |
| (Example 3) First light-adjusting layer b, Second light-adjusting layer c | (0.68, 0.32) | (0.27, 0.68) | (0.13, 0.13) | 65 | 78 | 55 | 21 | Color filter × 1 |
| (Comparative Example 1) No light-adjusting layer | (0.67, 0.33) | (0.30, 0.65) | (0.13, 0.17) | 100 | 100 | 100 | 100 | None |
| (Comparative Example 2) First light-adjusting layer a only | (0.67, 0.33) | (0.30, 0.65) | (0.13, 0.12) | 86 | 100 | 53 | 42 | Color filter × 1 |
| (Comparative Example 3) Second light-adjusting layer a only | (0.68, 0.32) | (0.25, 0.69) | (0.13, 0.16) | 60 | 71 | 85 | 38 | None |
| (Comparative Example 4) First light-adjusting layer a, BM | (0.67, 0.33) | (0.30, 0.65) | (0.13, 0.12) | 86 | 100 | 53 | 27 | Color filter × 1 Black matrix × 1 |
| (Comparative Example 5) Three-color filters, BM | (0.68, 0.32) | (0.29, 0.66) | (0.13, 0.12) | 67 | 92 | 55 | 15 | Color filter × 3 Black matrix × 1 |
| (Comparative Example 6) First light-adjusting layer a, second light-adjusting layer d | (0.67, 0.33) | (0.31, 0.65) | (0.13, 0.11) | 70 | 69 | 40 | 23 | Color filter × 1 |

*First light-adjusting layer a (magenta color filter, satisfying Condition 1), First light-adjusting layer b (magenta color filter, not satisfying Condition 1), Second light-adjusting layer a (satisfying Conditions 2 and 4), Second light-adjusting layers b, c (satisfying Conditions 3 and 4), Second light-adjusting layer d (not satisfying any of Conditions 2 to 4),
BM: Black Matrix

TABLE 2

| | | Unit | Example 1 | Example 2 | Example 3 |
|---|---|---|---|---|---|
| First light-adjusting layer | Maximum transmission factor | % | 85 | 85 | 85 |
| | Minimum transmission factor | % | 30 | 30 | 30 |
| | Wavelength with 60% transmission factor — Short-wavelength side | nm | 502 | 502 | 517 |
| | Wavelength with 60% transmission factor — Long-wavelength side | nm | 584 | 584 | 584 |
| | Wavelength with minimum transmission factor | nm | 550 | 550 | 558 |
| Second light-adjusting layer | Maximum transmission factor | % | 90 | 90 | 90 |
| | Minimum transmission factor | % | 25 | 40 | 35 |
| | Wavelength with 60% transmission factor — Short-wavelength side | nm | 558 | 568 | 566 |
| | Wavelength with 60% transmission factor — Long-wavelength side | nm | 612 | 602 | 604 |
| | Wavelength with minimum transmission factor | nm | 585 | 585 | 585 |

Here, the spectrum after transmitting the light-adjusting layer is calculated by multiplying the absorption spectrums of the light-adjusting layers used in the examples 1 to 3 and the comparative examples 1 to 6 with the EL spectrums illustrated in FIG. 7.

The chromaticity is calculated from the spectrum after transmitting the light-adjusting layer.

The luminance ratio is calculated by an area ratio of spectrums after transmitting the light-adjusting layer (in consideration with the luminosity curve).

The reflectance of external light is calculated from an area ratio of the spectrum obtained from the spectrum of the fluorescent light in FIG. 13 transmitting the light-adjusting layer twice, namely, when entering and outgoing the light-adjusting layer (in consideration with the luminosity curve).

Note that, these calculation results are separately confirmed to be valid values highly matching actually measured values.

With reference to the table 1, a comparison between the comparative example 1 and the example 1 and the example 2 shows the following.

In both the examples 1 and 2, the chromaticity of all colors, red, blue, and green is improved. In particular, the chromaticity of blue significantly improved. The chromaticity of blue is improved by the magenta color filter positioned with the blue pixels, and the chromaticity of green and red is improved by the second light-adjusting layer.

Furthermore, the reflectance of external light is significantly reduced. Arranging the magenta color filter above the blue pixels and the red pixels suppresses the transmission of green toward the inside of the panel. Furthermore, by providing the second light-adjusting layer, the reflectance of external light is improved.

Accordingly, the first light-adjusting layer and the second light-adjusting layer significantly contribute to the improvement in the chromaticity and the reflectance of external light.

In addition, the comparison between the comparative example 2 and the examples 1 and 2 shows the following.

The reflectance of external light is improved in both the examples 1 and 2. This improvement is because the second light-adjusting layer absorbs the external light.

Accordingly, the reflectance on external light is improved by using the second light-adjusting layer.

In addition, the comparison between the comparative example 3 and the examples 1 and 2 shows the following.

The chromaticity in blue and the reflectance of external light are improved in both the examples 1 and 2. This is because the chromaticity in blue is improved by the magenta color filter which transmits blue in the first light-adjusting layer.

The improvement on the reflectance of external light is because the transmission of green light into the panel is suppressed by arranging the magenta color filter above the blue pixels and the red pixels. In the example 2, the reflection of external light is suppressed by the black matrix absorbing the external light, in addition to the magenta color filter absorbing the external light.

The description above indicates that the first light-adjusting layer is important for improving the chromaticity in blue and the reflectance of external light.

In addition, the comparison between the comparative example 4 and the examples 1 and 2 shows the following.

The reflectance of external light is improved in both the examples 1 and 2. This improvement is by the second light-adjusting layer absorbing the external light.

Accordingly, the reflectance on external light is improved by using the second light-adjusting layer.

In addition, the comparison between the comparative example 5 and the examples 1 and 2 shows the following.

Although the example 1 is slightly lower on the light-emission luminance ratio compared to the comparative example 5, the example 1 and the example 2 achieve chromaticity and the reflectance of external light comparable to the comparative example 5. In particular, the external light reflection is improved in the example 2.

Furthermore, compared to the comparative example 5, the examples 1 and 2 require less manufacturing processes, and thus it is possible to reduce the cost for the manufacturing processes.

Suppressing the external light reflection by introducing the is black matrix as in the example 2 facilitates, the selection of the spectral shape of the first light-adjusting layer and the second light-adjusting layer allowing both secured transmission amount of EL light emission and absorption of the external light.

For example, the absorption spectrums of the second light-adjusting layer are compared between the example 1 illustrated in FIG. 8 and the example 2 illustrated in FIG. 9. In the example 2, the transmission factor of the second light-adjusting layer is increased compared with the example 1 since the black matrix absorbs the external light (in other words, the requirement on the absorption capacity for the second light-adjusting layer is reduced). As in the example 2, it is possible to improve the light-emission luminance ratio by introducing the black matrix.

The comparison between the examples 1 and 3 shows the following.

Although the configuration of the example 1 is identical to the example 3 except for the spectral shapes of the first light-adjusting layer and the second light-adjusting layer, in the example 1, the first light-adjusting layer satisfies the condition 1 and the second light-adjusting layer satisfies the conditions 2 and 3. Thus, with the example 1, it is possible to further reduce the reflectance of external light and improve the chromaticity of blue.

Furthermore, the comparison between the example 1 and the comparative example 6 shows the following.

In the comparative example 6, the coordinate values indicating the chromaticity of green shifts toward yellow compared to the coordinate values in the comparative example 1, showing the tendency of green turning toward yellow. In addition, the reflectance of external light is also increased. As such, in the comparative example 1, the display quality is decreased compared to the example 1.

This shows that, with regard to the spectrums of the first light-adjusting layer and the second light-adjusting layer, it is possible to further improve the reflectance of external light and the chromaticity of blue by optimizing the maximum value and the minimum value of the transmission factor of visible light, and the wavelength regions indicating 60% of the transmission factor and others.

In conclusion, based on the consideration above, according to the organic EL display device according to the examples of the present invention, it is possible to achieve the capacity equivalent to the conventional color filters in three colors and black matrix, such as chromaticity, luminance ratio, and the reflectance of the external light, and to reduce the cost necessary for manufacturing the color filters by using the first light-adjusting layer satisfying the condition 1 and the second light-adjusting layer satisfying at least the conditions 3 and 4 and more preferably satisfying the conditions 2 and 4.

Furthermore, by introducing the black matrix as in the example 2, it is possible to achieve the light-emission luminance ratio comparable to the light-emission luminance ratio of the configuration with the color filters in three colors and the black matrix while reducing the cost from the conventional technology.

Furthermore, as a result of numerous calculating using other EL spectrums and the absorption spectrums of the light-adjusting layer defined in the present invention, the inventors confirmed that the conclusion above holds true even when the spectral shapes (position of peak wavelength, half bandwidth, and spread of the end of the spectrum) are slightly changed.

Although only some exemplary embodiments of the organic EL display device according to the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

For example, in addition to the examples described above, other similar examples in which the second light-adjusting layer is placed at the different places are possible.

Figure 14:
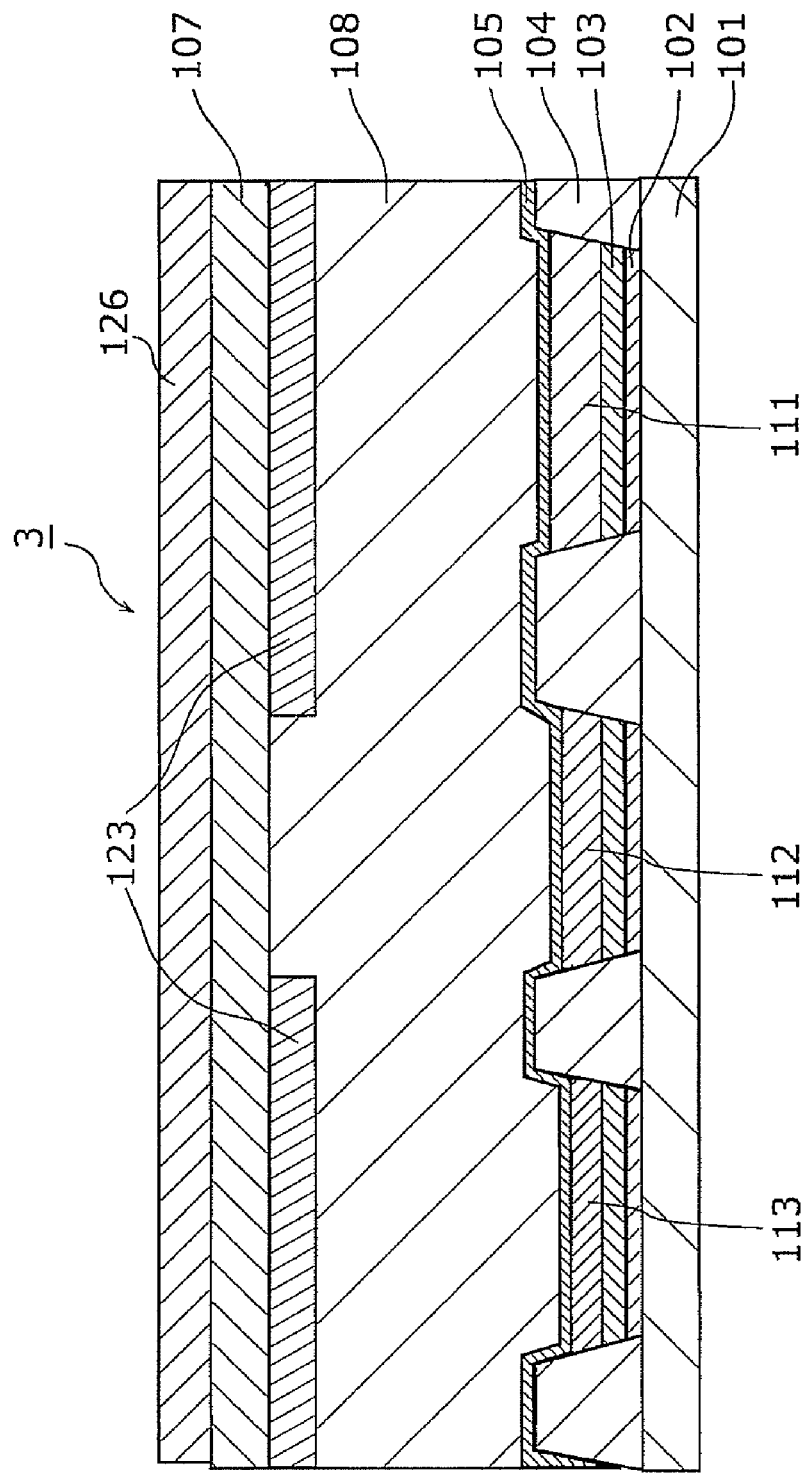
FIG. 14 is a cross-sectional view illustrating schematic configuration of main part of the organic EL display device according to a variation of the present invention.
Figure 15:
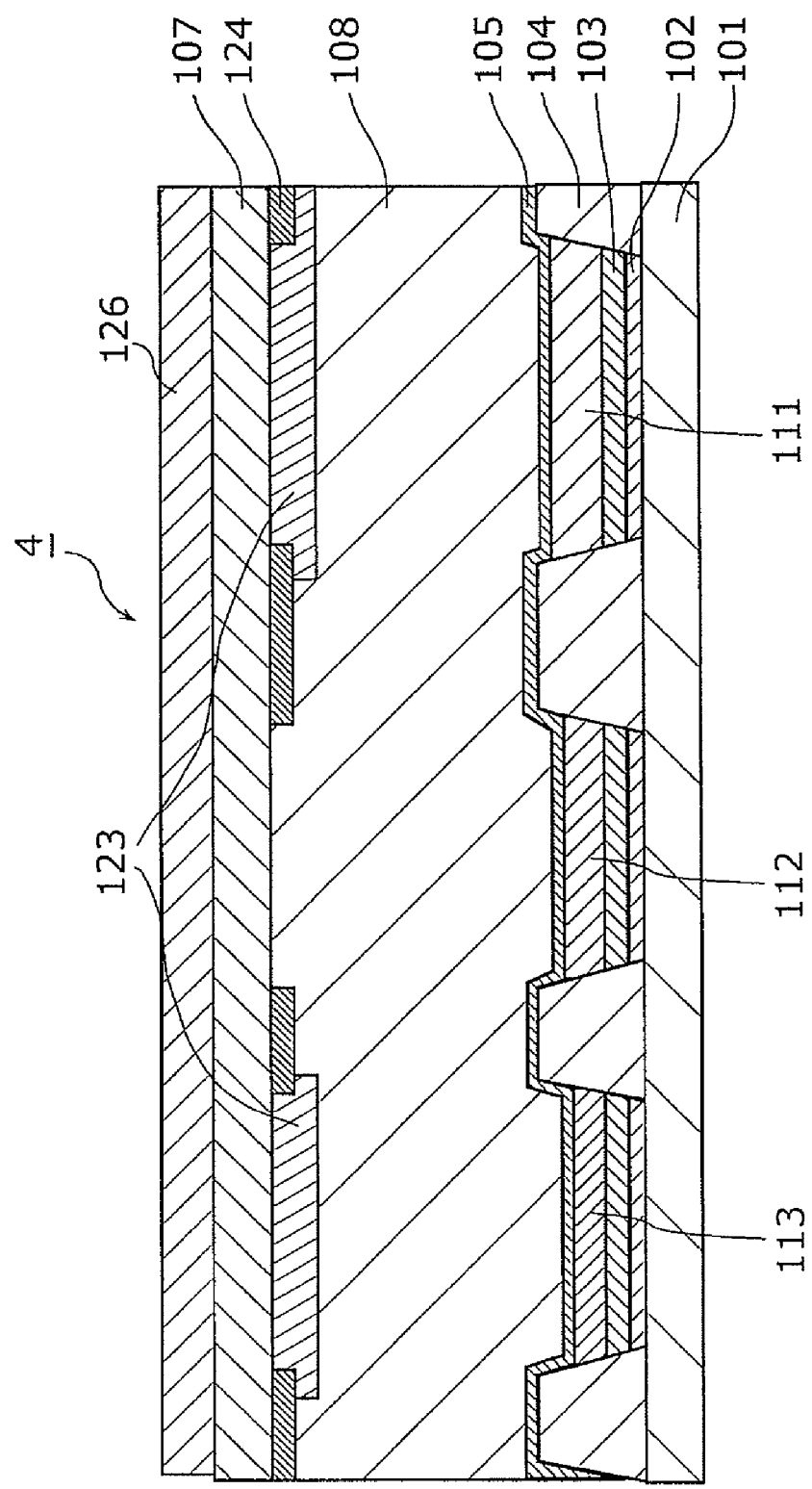
FIG. 15 is a cross-sectional view illustrating schematic configuration of main part of the organic EL display device according to the variation of the present invention.

As a similar example of the example 1, a configuration in which the second light-adjusting layer is an optical film provided as a film layer 126 outside of the substrate, as in the organic EL display device 3 illustrated in FIG. 14. This configuration is also applicable to the example 2 as in an organic EL display device 4 illustrated in FIG. 15. In these configurations, at the position of the second light-adjusting layer 106 in the organic EL display devices 1 and 2, a sealing layer 108 without light-adjusting function (for example, with a uniform transmission spectrum in the entire range of visible light) is provided.

These configurations are examples in which the film layer 126 is formed as the second light-adjusting layer outside of the sub substrate 107 which is a glass substrate of the plastic substrate. Both configurations in FIGS. 14 and 15 can achieve the effects expected in the present invention.

Figure 16:
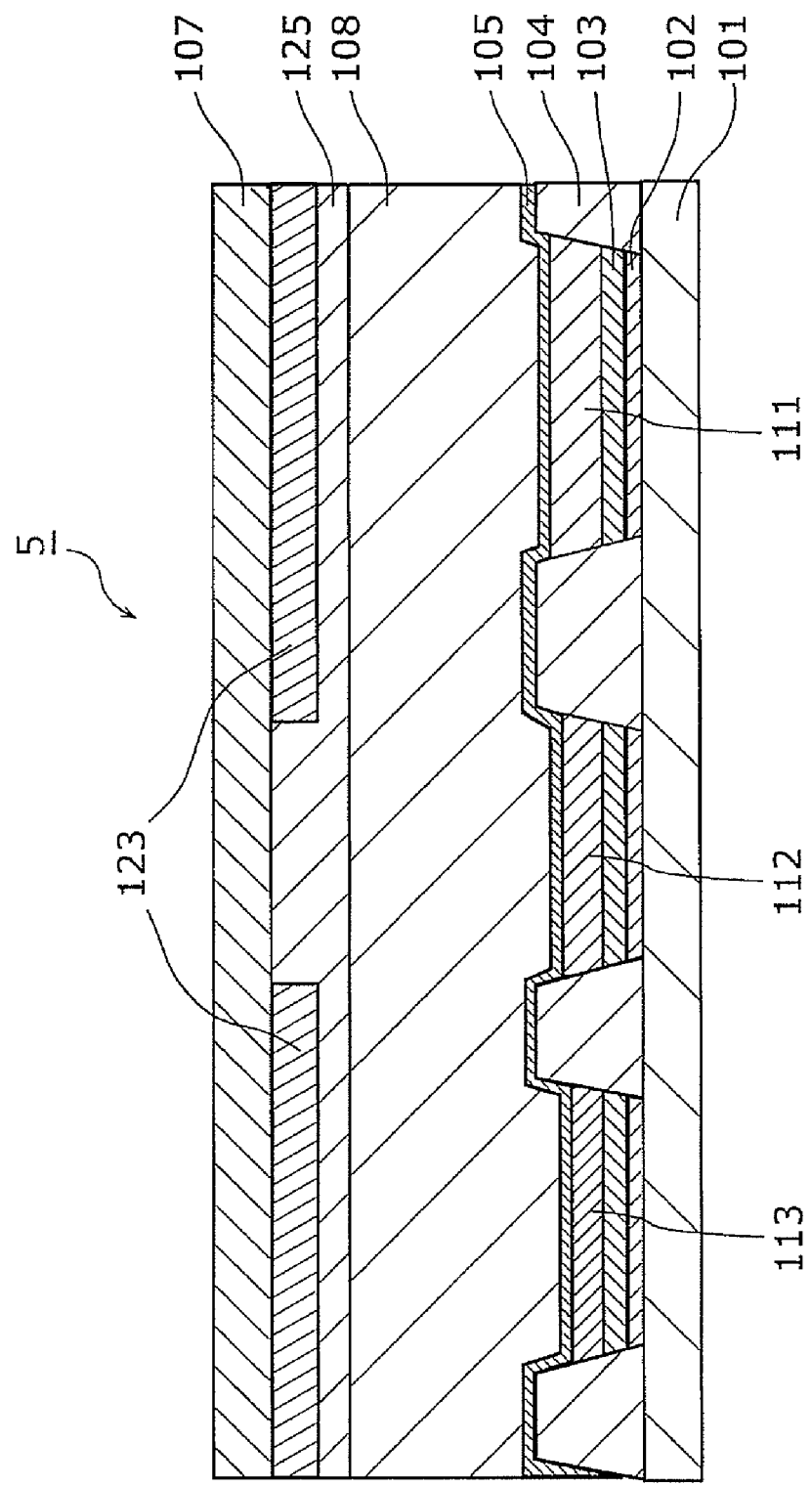
FIG. 16 is a cross-sectional view illustrating schematic configuration of main part of the organic EL display device according to the variation of the present invention.
Figure 17:
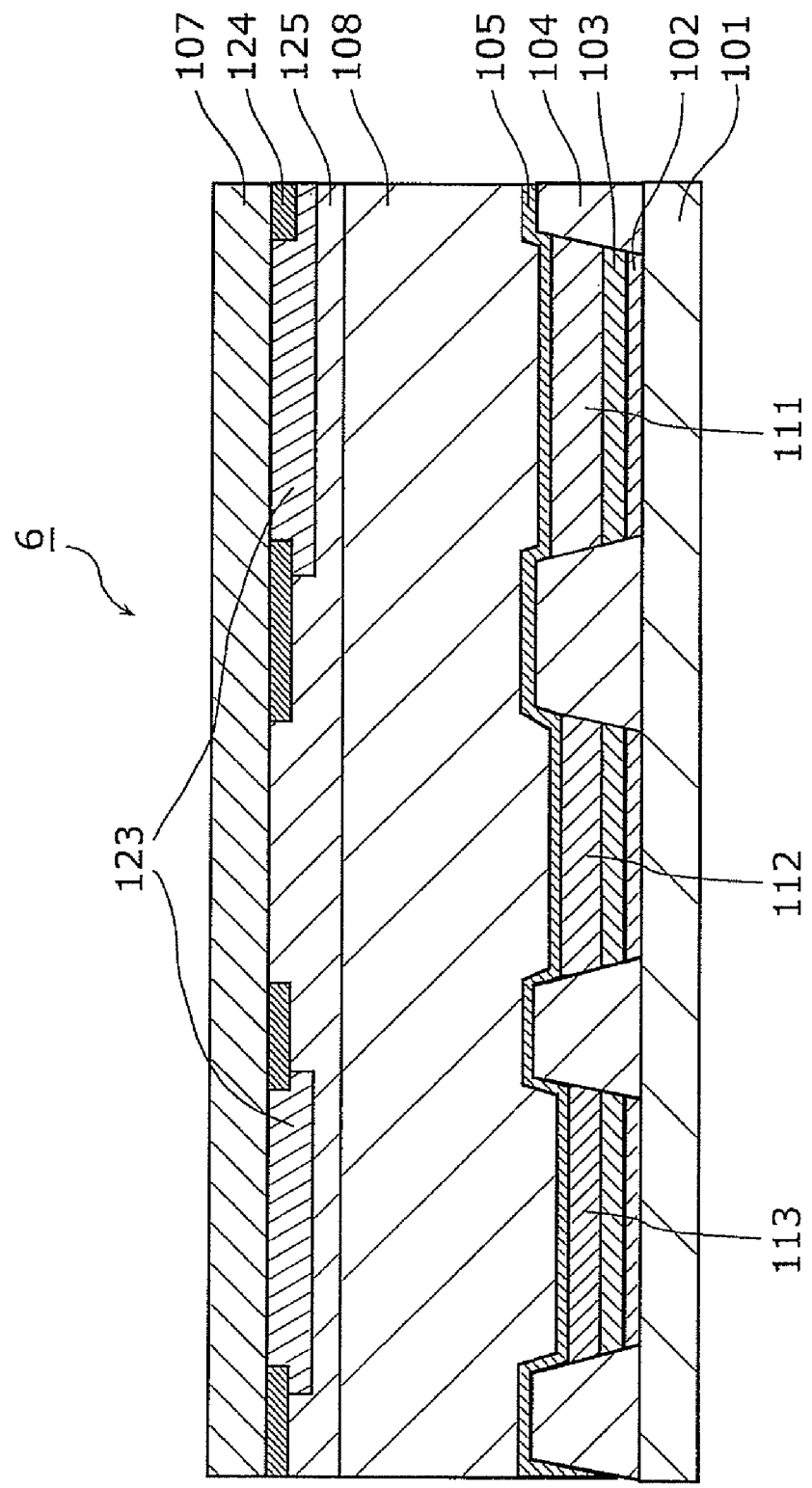
FIG. 17 is a cross-sectional view illustrating schematic configuration of main part of the organic EL display device according to the variation of the present invention.

Furthermore, in the manufacturing process of the color filter in general, there is a case in which, after the pattern for all colors are formed, the upper part of the pattern is protected by a transparent resin film (hereafter referred to as a protective layer). Polyimide, acrylic, or epoxy resins are used as the protective layer, for example. The function as the second light-adjusting layer may be added to the protective layer, and as in the organic EL display device 5 illustrated in FIG. 16 and the organic EL display device 6 illustrated in FIG. 17, the configuration in which the protective layer 125 is used as the second light-adjusting layer achieves the effect expected by the present invention. In this configuration, the sealing layer 108 without light-adjusting function is provided at the position of the second light-adjusting layer 106 in the organic EL display devices 1 and 2.

Note that, when the optical film or the resin layer is used as the second light-adjusting layer, the light-adjusting layer is merely placed on the entire surface of the substrate. Thus, the patterning of the resist as in the manufacturing process of the color filters is not necessary, thereby suppressing the manufacturing cost of the second light-adjusting layer compared to the color filters.

INDUSTRIAL APPLICABILITY

The organic EL display device according to the present invention is particularly applicable to large-screen active-matrix display devices combined with thin film transistors capable of emitting light in multiple colors, and is applicable to any display device such as televisions and personal computers.

What is claimed is:

1. A multicolor light-emitting organic electroluminescent (EL) display device including a plurality of organic EL light-emitting regions each of which emits red light, green light, or blue light and a non light-emitting region that are arranged on a main substrate, the multicolor light-emitting organic EL display device comprising:
    a first light-adjusting layer; and
    a second light-adjusting layer,
    wherein the first light-adjusting layer is a magenta color filter and is laid over a light-emitting region of the blue light, a light-emitting region of the red light, and the non light-emitting region,
    the second light-adjusting layer is made of resin, selectively absorbs light having a wavelength intermediate between the red light and the green light, and has: a maximum value of a transmission factor of visible light being 80% or greater; and a minimum value of the transmission factor being 25% or smaller; a wavelength indicating 60% of transmission factor in ranges between 550 nm and 580 nm and between 590 nm and 620 nm; and a wavelength indicating a minimum value of the transmission factor in a range between 580 nm and 600 nm, and
    the second light-adjusting layer is laid over the light-emitting region of the blue light, a light-emitting region of the green light, the light-emitting region of the red light, and the non light-emitting region.

2. The multicolor light-emitting organic EL display device according to claim 1,
    wherein the second light-adjusting layer has the transmission factor of 80% or greater in at least part of a wavelength range between 520 nm and 560 nm.

3. The multicolor light-emitting organic EL display device according to claim 1,
    wherein the first light-adjusting layer has a maximum value of a transmission factor of visible light being 80% or greater, a minimum value of the transmission factor being 40% or smaller, a wavelength indicating 60% of the transmission factor in ranges between 480 nm and 510 nm and between 560 nm and 590 nm.

4. The multicolor light-emitting organic EL display device according to claim 3,
wherein a wavelength indicating the minimum value of the transmission factor of the first light-adjusting layer is in a range between 520 nm and 550 nm.

5. The multicolor light-emitting organic EL display device according to claim 1,
wherein the second light-adjusting layer is formed substantially uniform across the entirety of the multicolor light-emitting organic EL display device.

6. The multicolor light-emitting organic EL display device according to claim 1,
wherein the first light-adjusting layer is formed on a glass substrate or a plastic substrate.

7. The multicolor light-emitting organic EL display device according to claim 6,
wherein the second light-adjusting layer is formed outside of the glass substrate or the plastic substrate.

8. The multicolor light-emitting organic EL display device according to claim 6,
wherein the plastic substrate is colored and functions as the second light-adjusting layer.

9. The multicolor light-emitting organic EL display device according to claim 1,
wherein the organic EL light-emitting regions and the first light-adjusting layer are bonded by a resin layer.

10. A method of manufacturing the multicolor light-emitting organic EL display device according to claim 1, the method comprising:
forming the first light-adjusting layer that is the magenta color filter over the light-emitting region of the blue light, the light-emitting region of the red light, and the non light-emitting region; and
forming the second light-adjusting layer that selectively absorbs the light having the wavelength intermediate between the red light and the green light over the light-emitting region of the blue light, the light-emitting region of the green light, the light-emitting region of the red light, and the non light-emitting region.

11. A multicolor light-emitting organic electroluminescent (EL) display device including a plurality of organic EL light-emitting regions each of which emits red light, green light, or blue light and a non light-emitting region that are arranged on a main substrate, the multicolor light-emitting organic EL display device comprising:
a first light-adjusting layer;
a second light-adjusting layer; and
a third light-adjusting layer,
wherein the first light-adjusting layer is a magenta color filter and is laid over a light-emitting region of the blue light, a light-emitting region of the red light,
the second light-adjusting layer is made of resin and selectively absorbs light having a wavelength intermediate between the red light and the green light, and has: a maximum value of a transmission factor of visible light being 80% or greater; a minimum value of the transmission factor being 40% or smaller; a wavelength indicating 60% of transmission factor in ranges between 550 nm and 580 nm and between 590 nm and 620 nm; and a wavelength indicating a minimum value of the transmission factor in a range between 580 nm and 600 nm,
the second light-adjusting layer is laid over the light-emitting region of the blue light, a light-emitting region of the green light, the light-emitting region of the red light, and the non light-emitting region, and
the third light-adjusting layer is laid over the non light-emitting region, and absorbs 90% or more of visible light.

12. The multicolor light-emitting organic EL display device according to claim 11,
wherein the second light-adjusting layer has the transmission factor of 80% or greater in at least part of a wavelength range between 520 nm and 560 nm.

13. The multicolor light-emitting organic EL display device according to claim 11,
wherein the first light-adjusting layer has a maximum value of a transmission factor of visible light being 80% or greater, a minimum value of the transmission factor being 40% or smaller, a wavelength indicating 60% of the transmission factor in ranges between 480 nm and 510 nm and between 560 nm and 590 nm.

14. The multicolor light-emitting organic EL display device according to claim 13,
wherein a wavelength indicating the minimum value of the transmission factor of the first light-adjusting layer is in a range between 520 nm and 550 nm.

15. The multicolor light-emitting organic EL display device according to claim 11,
wherein the second light-adjusting layer is formed substantially uniform across the entirety of the multicolor light-emitting organic EL display device.

16. The multicolor light-emitting organic EL display device according to claim 11,
wherein the first light-adjusting layer is formed on a glass substrate or a plastic substrate.

17. The multicolor light-emitting organic EL display device according to claim 16,
wherein the second light-adjusting layer is formed outside of the glass substrate or the plastic substrate.

18. The multicolor light-emitting organic EL display device according to claim 16,
wherein the plastic substrate is colored and functions as the second light-adjusting layer.

19. The multicolor light-emitting organic EL display device according to claim 11,
wherein the organic EL light-emitting regions and the first light-adjusting layer are bonded by a resin layer.

20. A method of manufacturing the multicolor organic EL display device according to claim 11, the method comprising:
forming the first light-adjusting layer that is the magenta color filter over the light-emitting region of the blue light and the light-emitting region of the red light;
forming a third light-adjusting layer that absorbs 90% or more of visible light over the non light-emitting region; and
forming the second light-adjusting layer that selectively absorbs the light having the wavelength intermediate between the red light and the green light over the light-emitting region of the blue light, the light-emitting region of the green light, the light-emitting region of the red light, and the non light-emitting region.

* * * * *